(12) United States Patent
Bruss et al.

(10) Patent No.: US 10,362,717 B2
(45) Date of Patent: Jul. 23, 2019

(54) FLEXIBLE ELECTRICALLY CONDUCTIVE BONDING FILMS

(71) Applicant: 3M INNOVATIVE PROPERTIES COMPANY, St. Paul, MN (US)

(72) Inventors: Jeanne M. Bruss, Cottage Grove, MN (US); Jeffrey W. McCutcheon, Baldwin, WI (US); Roger A. Grisle, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/751,261

(22) PCT Filed: Aug. 17, 2016

(86) PCT No.: PCT/US2016/047400
§ 371 (c)(1),
(2) Date: Feb. 8, 2018

(87) PCT Pub. No.: WO2017/031229
PCT Pub. Date: Feb. 23, 2017

(65) Prior Publication Data
US 2018/0235113 A1      Aug. 16, 2018

Related U.S. Application Data

(60) Provisional application No. 62/207,467, filed on Aug. 20, 2015.

(51) Int. Cl.
*H05K 9/00* (2006.01)
*B32B 5/02* (2006.01)
(Continued)

(52) U.S. Cl.
CPC .............. *H05K 9/0032* (2013.01); *B32B 3/02* (2013.01); *B32B 3/263* (2013.01); *B32B 3/30* (2013.01);
(Continued)

(58) Field of Classification Search
CPC ...... H05K 9/032; H05K 1/0218; H05K 1/023; H05K 3/22; B32B 3/02; B32B 3/263;
(Continued)

(56) References Cited

U.S. PATENT DOCUMENTS 5,604,026 A * 2/1997 King .......................... C09J 9/02
428/317.1
6,214,460 B1    4/2001 Bluem
(Continued)

FOREIGN PATENT DOCUMENTS

KR        20120028583       *  3/2012

OTHER PUBLICATIONS

International Search Report for PCT International Application No. PCT/US2016/047400, dated Nov. 24, 2016, 3 pages.

*Primary Examiner* — Timothy J Thompson
*Assistant Examiner* — Charles Pizzuto
(74) *Attorney, Agent, or Firm* — Yufeng Dong

(57) ABSTRACT

Flexible films including an electrically conductive layer being sandwiched by two electrically insulating layers in a layered structure are provided. The layered structure extends continuously from at least one first zone to at least one second zone along a lateral direction of the flexible film, and the at least one first zone is positioned around a periphery of the respective at least one second zone. In the at least one first zone the three layers are at least partially intermixed with each other to provide an electrically conductive surface in the at least one first zone on the side of the first major surface of the layered structure, and in the at least one
(Continued)

second zone the first major surface remains electrically non-conductive.

20 Claims, 9 Drawing Sheets

(51) Int. Cl.
| | |
|---|---|
| B32B 3/26 | (2006.01) |
| B32B 15/08 | (2006.01) |
| B32B 27/30 | (2006.01) |
| B32B 27/32 | (2006.01) |
| B32B 27/36 | (2006.01) |
| B32B 27/34 | (2006.01) |
| B32B 37/30 | (2006.01) |
| B32B 37/18 | (2006.01) |
| H05K 3/22 | (2006.01) |
| H05K 1/02 | (2006.01) |
| B32B 7/02 | (2019.01) |
| B32B 27/12 | (2006.01) |
| B32B 27/38 | (2006.01) |
| B32B 7/12 | (2006.01) |
| B32B 27/08 | (2006.01) |
| B32B 27/16 | (2006.01) |
| B32B 27/20 | (2006.01) |
| B32B 3/02 | (2006.01) |
| B32B 3/30 | (2006.01) |
| H05K 1/18 | (2006.01) |

(52) U.S. Cl.
CPC ............... *B32B 5/022* (2013.01); *B32B 7/02* (2013.01); *B32B 7/12* (2013.01); *B32B 15/08* (2013.01); *B32B 27/08* (2013.01); *B32B 27/12* (2013.01); *B32B 27/16* (2013.01); *B32B 27/205* (2013.01); *B32B 27/306* (2013.01); *B32B 27/308* (2013.01); *B32B 27/32* (2013.01); *B32B 27/34* (2013.01); *B32B 27/36* (2013.01); *B32B 27/38* (2013.01); *B32B 37/182* (2013.01); *B32B 37/30* (2013.01); *H05K 1/023* (2013.01); *H05K 1/0218* (2013.01); *H05K 3/22* (2013.01); *B32B 2255/10* (2013.01); *B32B 2255/205* (2013.01); *B32B 2262/0276* (2013.01); *B32B 2262/106* (2013.01); *B32B 2307/202* (2013.01); *B32B 2307/206* (2013.01); *B32B 2307/546* (2013.01); *B32B 2323/00* (2013.01); *B32B 2333/00* (2013.01); *B32B 2367/00* (2013.01); *B32B 2377/00* (2013.01); *B32B 2457/08* (2013.01); *H05K 1/181* (2013.01); *H05K 9/0084* (2013.01); *H05K 9/0086* (2013.01); *H05K 2201/0715* (2013.01); *H05K 2201/10371* (2013.01); *H05K 2203/061* (2013.01)

(58) Field of Classification Search
CPC .. B32B 3/30; B32B 5/022; B32B 7/02; B32B 7/12; B32B 15/08; B32B 27/08; B32B 27/12; B32B 27/16; B32B 27/205; B32B 27/306; B32B 27/308; B32B 27/32; B32B 27/34; B32B 27/36; B32B 27/38; B32B 37/182; B32B 37/30
USPC .......................................... 174/260; 361/760
See application file for complete search history.

(56) References Cited

U.S. PATENT DOCUMENTS

| | | |
|---|---|---|
| 2001/0033478 A1 | 10/2001 | Ortiz |
| 2003/0112616 A1 | 6/2003 | Doi |
| 2010/0059853 A1 | 3/2010 | Lin |
| 2013/0278349 A1 | 10/2013 | Dayan |
| 2013/0286609 A1 | 10/2013 | Merz |

* cited by examiner

FLEXIBLE ELECTRICALLY CONDUCTIVE BONDING FILMS

CROSS REFERENCE TO RELATED APPLICATIONS

This application is a national stage filing under 35 U.S.C. 371 of PCT/US2016/047400, filed Aug. 17, 2016, which claims the benefit of U.S. Application No. 62/207,467, filed Aug. 20, 2015, the disclosure of which is incorporated by reference in its/their entirety herein.

TECHNICAL FIELD

The present disclosure relates to flexible films including an electrically conductive layer sandwiched by two electrically insulating layers, and methods of making and using the same.

BACKGROUND

Metallic cans have been used to cover electronic components on a circuit board and work as a Faraday Cage to provide appropriate electromagnetic interference (EMI) shielding A metallic Faraday Cage may include a metal can frame or fence, and a metal lid attached to the top of the metal can frame or fence by welding, mechanical clips, pins, indents or combinations thereof.

SUMMARY

Briefly, in one aspect, the present disclosure describes a flexible film including an electrically conductive layer, and first and second electrically insulating layers. The electrically conductive layer is sandwiched by the first and second electrically insulating layers in a layered structure. The layered structure has a first major surface on the side of the first electrically insulating layer and a second major surface on the side of the second electrically insulating layer opposite the first major surface. The layered structure extends continuously from at least one first zone to at least one second zone along a lateral direction of the flexible film, and the at least one first zone is positioned around a periphery of the respective at least one second zone. In the at least one first zone the electrically conductive layer and the first and second electrically insulating layers are at least partially intermixed with each other to provide an electrically conductive surface in the at least one first zone on the side of the first major surface of the layered structure, and in the at least one second zone the first major surface remaining electrically non-conductive.

In another aspect, the present disclosure describes a system including an electrically conductive fence disposed on and projecting from a major surface of a circuit board. The electrically conductive fence at least partially surrounds one or more of electronic components on the circuit board. The electrically conductive fence is connected to a different second electrically conductive trace of the circuit board. A flexible film is disposed on a top of the electrically conductive fence, and faces the major surface of the circuit board. The flexible film includes an electrically conductive layer, and first and second electrically insulating layers. The electrically conductive layer is sandwiched by the first and second electrically insulating layers in a layered structure. The layered structure has a first major surface on the side of the first electrically insulating layer and a second major surface on the side of the second electrically insulating layer opposite the first major surface. The layered structure extends continuously from at least one first zone to at least one second zone along a lateral direction of the flexible film, and the at least one first zone is positioned around a periphery of the respective at least one second zone. In the at least one first zone the electrically conductive layer and the first and second electrically insulating layers are at least partially intermixed with each other to provide an electrically conductive surface in the at least one first zone on the side of the first major surface of the layered structure, and in the at least one second zone the first major surface remains electrically non-conductive. The at least one first zone of the flexible film is directly bonded to the top of the electrically conductive fence.

In another aspect, the present disclosure describes a method of making a flexible film. The method includes arranging a first electrically insulating layer, an electrically conductive layer, and a second electrically insulating layer in a layered structure. The electrically conductive layer is sandwiched by the first and second electrically insulating layers. The layered structure has a first major surface on the side of the first electrically insulating layer and a second major surface on the side of the second electrically insulating layer opposite the first major surface. The method further includes selectively treating at least one first zone of the layered structure such that the electrically conductive layer and the first and second electrically insulating layers are at least partially intermixed with each other in the least one first zone to provide an electrically conductive surface in the at least one first zone on the side of the first major surface of the layered structure, and in the at least one second zone the first major surface being electrically non-conductive. The layered structure extends continuously from the at least one first zone to at least one second zone along a lateral direction of the flexible film, and the at least one first zone is positioned around a periphery of the respective at least one second zone.

Various unexpected results and advantages are obtained in exemplary embodiments of the disclosure. One such advantage of exemplary embodiments of the present disclosure is that flexible films provide electrically conductive bottom surfaces in treated zones that is capable of bonding to the top of an electrically conductive fence, which can substantially eliminate any bond-line gaps therebetween and provide efficient EMI shielding. In addition, in untreated zones, the bottom surfaces can be electrically insulating and prevent short-circuit problems.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1A:
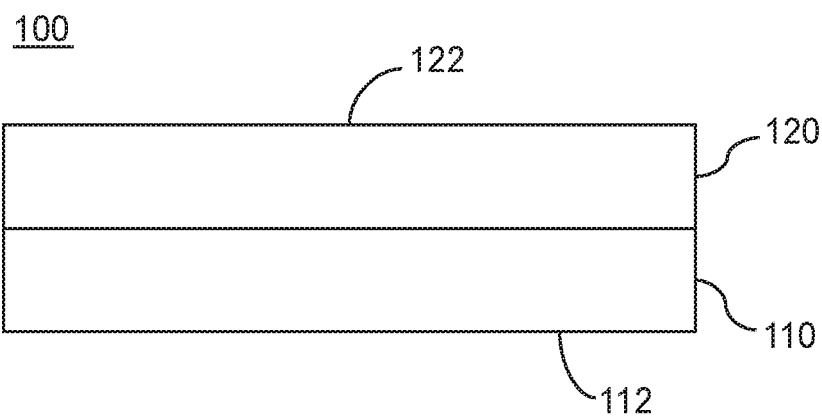
FIG. 1A is a cross sectional view of a film including an electrically conductive layer and an electrically insulating layer arranged in a layered structure, according to one embodiment.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The terms "intermixing" and "inter-diffusion" are interchangeably used herein and refer to desired zone(s) of a layered structure where the materials of adjacent layers diffuse into each other.

The term "curable material" refers to a material that undergoes a chemical reaction to form molecular bonds and crosslinks. The chemical reaction can be initiated by methods such as for example heat, ultraviolet, electron beam, moisture, etc. and is typically permanent and irreversible.

The term "thermosetable material" refers to a material that undergoes a chemical reaction to form molecular bonds and crosslinks initiated by heat.

The term "homogeneous" means exhibiting only a single phase of matter when observed at a macroscopic scale.

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

The term "(meth)acrylate" with respect to a monomer, oligomer or means a vinyl-functional alkyl ester formed as the reaction product of an alcohol with an acrylic or a methacrylic acid.

The term "adjoining" with reference to a particular layer means joined with or attached to another layer, in a position wherein the two layers are either next to (i.e., adjacent to) and directly contacting each other, or contiguous with each other but not in direct contact (i.e., there are one or more additional layers intervening between the layers).

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

By using the term "overcoated" to describe the position of a layer with respect to a substrate or other element of an article of the present disclosure, we refer to the layer as being atop the substrate or other element, but not necessarily contiguous to either the substrate or the other element.

By using the term "separated by" to describe the position of a layer with respect to other layers, we refer to the layer as being positioned between two other layers but not necessarily contiguous to or adjacent to either layer.

The terms "about" or "approximately" with reference to a numerical value or a shape means +/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

FIG. 1A illustrates a cross sectional view of a flexible film 100 including a first layer 110 and a second layer 120 arranged in a layered structure. The layered structure has a first major surface 112 on the side of the first layer 110, and a second major surface 122 on the side of the second layer 120. The first layer 110 is an electrically insulating layer, and the second layer 120 is an electrically conductive layer such that the first major surface 112 of the film 100 is electrically insulating and the second major surface 122 is electrically conductive. The first and second layers may respectively have a first thickness and a second thickness, for example, from a few microns to a few hundred microns. In some embodiments, the first layer 110 may have a thickness, for example, at least 25%, 50%, 75%, 100%, 150%, or 200% of the thickness of the second layer 120. In some embodiments, the first layer 110 may have a thickness, for example, no more than 200%, 300%, 400%, 500%, 600%, 700%, 800%, 900% or 1000% of the thickness of the second layer 120. In some embodiments, the first layer 110 may have a thickness of, for example, from about 10 microns to about 500 microns, and the second layer 120 may have a thickness of, for example, from about 5 microns to about 200 microns.

In some embodiments, the first layer 110 can be a thermoplastic layer including one or more thermoplastic materials. In some embodiments, the thermoplastic materials can include polyester and derivatives such as, for example, polyester, polybutylene terephthalates, copolyesters, etc. In some embodiments, the thermoplastic materials can include polamides, copolyamides, etc. In some embodiments, the thermoplastic materials can include olefinic derivatives such as polyethylene, polypropylene, ethylene acrylic acid, ethylene vinyl acetates, ethylene acrylate, etc. In some embodiments, the thermoplastic materials can include thermoplastic elastomers such as SIS, SEBS, SBS, etc. In some embodiments, the thermoplastic materials can include polyurethanes such as polyesters, polyethers, polycaprolactone, aromatics (e.g., MDI), aliphatics (e.g., H12 MDI, HDI and IPDI). In some embodiments, the thermoplastic layer can include one or more thermoplastic adhesives that are capable of bonding to a surface, for example, a metal surface. In some embodiments, the first layer 110 can be a curable layer that can be curable by one or more of UV, moisture, pressure, and heat to produce a crosslinked material. In some embodiments, the first layer 110 can be a thermosetting layer including heat-curable, thermosetable materials. The first layer 110 may include, for example, one or more of an acrylate polymer, a polyepoxide resin, an epoxy acrylic, a heat-activatable modified aliphatic amine polyepoxide resin curing agent, etc. Exemplary thermosetable resins are described in U.S. Pat. No. 6,214,460 (Bluem et al.), which is incorporated herein by reference.

In some embodiments, the surface of the first layer 110 may be tacky at room temperatures. In some embodiments, the material of the first layer 110 can be softened or tackified by, for example, applying heat and/or pressure. In addition, the material of the first layer 110 may have a relatively low viscosity and can diffuse through a porous structure by applying at least one of pressure and heat. It is to be understood the rheology characteristics (e.g., viscoelasticity) of the first layer 110 may vary upon the pressure/heat applied.

In some embodiments, the majority of the material (e.g., 50% or more by weight or volume) in the first layer 110 may not be a pressure sensitive adhesive (PSA) material. A PSA material may not provide sufficient bonding strength to the top of a fence and durability/reliability as required by the present application.

The second layer 120 can be a porous electrically conductive layer. The second layer 120 can include pores/gaps that allow the material of the first layer 110 to flow/diffuse therethrough upon pressure and/or heat. Such flow or diffusion can intermix the materials of the first and second layers 110 and 120 in desired zones. In some embodiments, the second layer 120 may have a porosity or void fraction, for example, no less than about 30%, no less than about 50%, no less than about 70%, or no less than about 90%. It is to be understood that the second layer 120 may have at least a portion with a porosity lower than 30%. In some embodiments, the porous electrically conductive layer may include one or more of non-woven materials and porous woven conductive fabrics. The non-woven material can include a plurality of electrically conductive fibers. In some embodiments, the electrically conductive fibers can include a plurality of electrically insulating fibers coated with one or more electrically conductive materials. The electrically insulating fibers can include, for example, polyester, nylon, carbon fibers, etc. The electrically conductive coating material can include, for example, nickel, copper, silver, etc. In some embodiments, optional fillers can be added to enhance the electrical conductivity and grounding performance of the electrical conductive layer. The optional fillers may include, for example, electrically conductive particles, flakes and/or fibers. Electrically conductive materials can be solid metals such as silver, nickel, or metal plated core materials such as silver plated glass flakes. Optional fillers may also include carbon based fibers and/or particles.

Figure 1B:
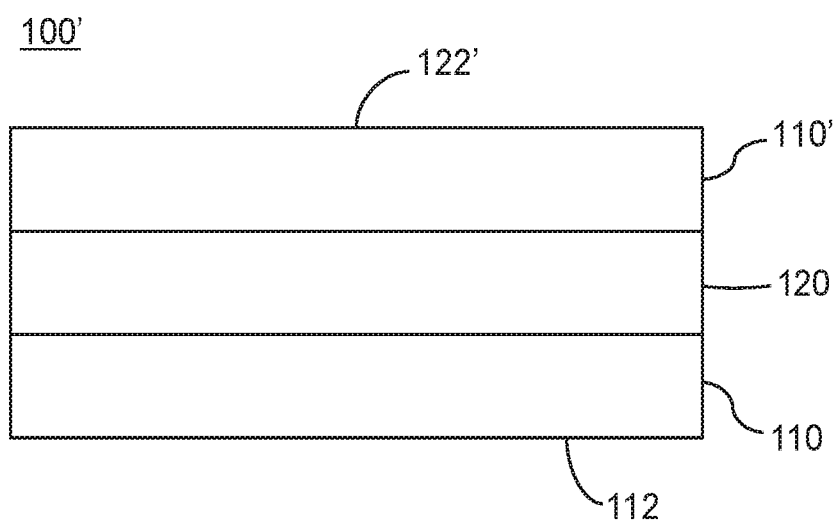
FIG. 1B is a cross sectional view of a film including an electrically conductive layer sandwiched by two electrically insulating layers and arranged in a layered structure, according to one embodiment.

FIG. 1B illustrates a cross sectional view of a flexible film 100' including the electrically conductive layer 120 sandwiched by electrically insulating layers 110 and 110' which are arranged in a layered structure. The electrically insulating layers 110' can have the same composition as the layer 110 disposed on the opposite side of the electrically conductive layer 120. The layered structure has a first major surface 112 on the side of the first layer 110, and a second major surface 122' on the side of the layer 110'. The layers 110 and 110' are electrically insulating such that the major surface 112 and 122' of the film 100' are electrically insulating in the absence of further treating. It is to be understood that in some embodiments, the electrically insulating layers 110 and 110' may be different, for example, being formed by different electrically insulating materials and/or having different thicknesses.

Figure 2A:
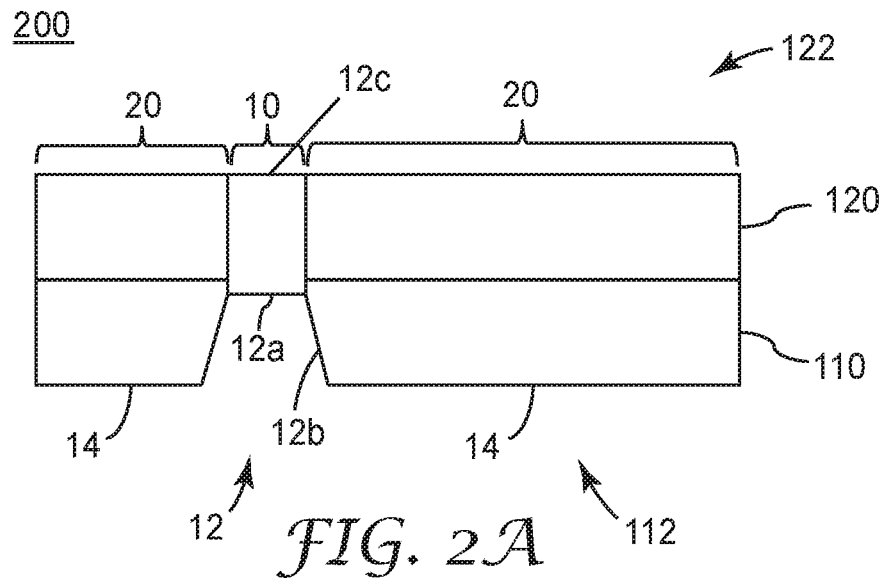
FIG. 2A is a cross sectional view of the film of FIG. 1A where a first zone of the layered structure is treated, according to one embodiment.

FIG. 2A illustrates a cross sectional view of a flexible film 200 that is formed by selectively treating the film 100 of FIG. 1A, according to one embodiment. The flexible film 200 includes at least one first zone 10 and at least one second zone 20. The first layer 110 and the second layer 120 form a layered structure that extends continuously from the at least one first zone 10 to the at least one second zone 20 along a lateral direction of the flexible film 200. The at least one first zone 10 is positioned around a periphery of the at least one second zone 20. In the depicted embodiment, the first zone 10 is positioned to separate two adjacent second zones 20. In the at least one first zone 10, the first layer 110 and the second layer 120 are at least partially intermixed with each other. In the depicted embodiment, the material of the first layer 110 is diffused into the second layer 120 upon application of at least one of heat and pressure, which results in the intermixing of the first and second layers 110 and 120 to form the first zone 10.

In some embodiments, the at least one first zone 10 can be treated by heat at a temperature, for example, no less than 80° C., no less than 100° C., no less than 120° C., or no less than 130° C. The heat may be applied at a temperature, for example, no greater than 200° C., no greater than 180° C., or no greater than 160° C. In some embodiments, the pressure applied can be in the range, for example, from several psi to several tens psi. It is also to be understood that the temperature and pressure applied to treat the first zone can be optimized based on many variables such as, for example, the specific materials of the first and second layers, the respective thicknesses of the layers, the initial surface profiles of the layers, the surface conditions of the top of the fence 2, etc.

The first zone 10 may have a reduced thickness compared to the second zone 20. In some embodiments, the thickness may be reduced by, for example, about 20% or more, about 30% or more, about 40% or more, about 50% or more, or about 60% or more. As shown in FIG. 2A, the reduction of thickness is primarily on the side of the first layer 110. In some embodiments, about 80% or more, about 90% or more, or about 95% or more of the reduction of thickness on the side of the first layer 110.

In the at least one first zone 10 on the side of the first major surface 112 of the layered structure, an electrically conductive surface 12 is formed upon the intermixing of the first and second layers 110 and 120. The electrically conductive surface 12 may include a bottom surface 12a of the first zone 10. In some embodiments, at least a portion of a side surface 12b adjacent the bottom surface 12a may be electrically conductive. The electrical conductivity on the otherwise insulating bottom surface 112 in the first zone 10 may be due to the presence of material from the second layer 120 thereon resulting from the intermixing/diffusion. In the at least one second zone 20, the first major surface 112 remain electrically non-conductive (e.g., referring to the surface area 14 in FIG. 2A).

In the at least one first zone 10 on the side of the second major surface 122 of the layered structure, an upper surface 12c is formed. The upper surface 12c is opposite the bottom surface 12a and may exhibit substantially the same properties (for example, electrically conductive, tacky, etc.) as the bottom surface 12a. For example, the upper surface 12c may be capable of bonding to a metal surface due to the diffusion of tacky material from the first layer 110 onto the second major surface 122 in the first zone 10. In addition, the upper surface 12c in the first zone 10 may substantially retain its electrical conductivity. In the at least one second zone 20, the second major surface 122 remain unchanged.

The film 200 can be formed by selectively treating the at least one first zone 10 by applying, for example, at least one of pressure and heat, which will be described in more detail further below.

Figure 2B:
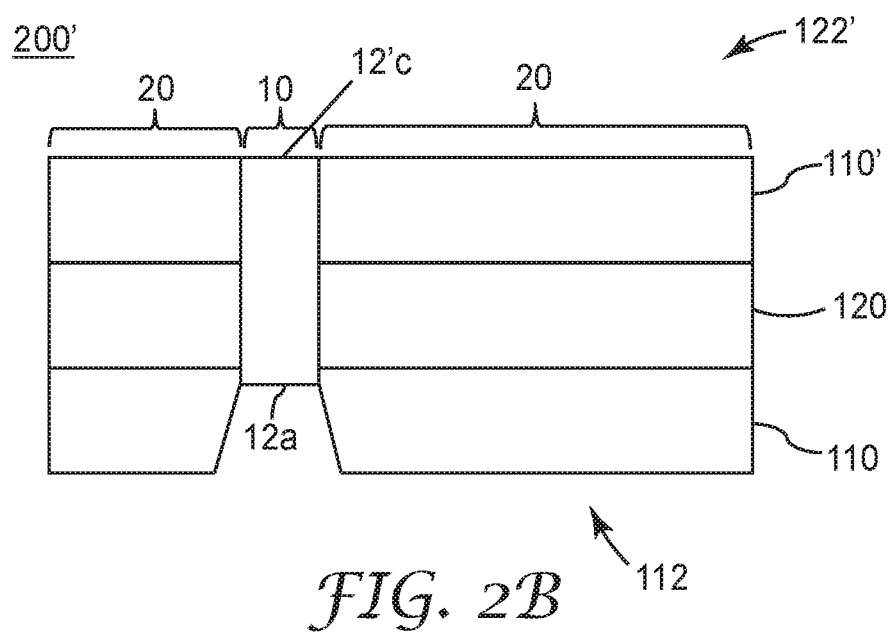
FIG. 2B is a cross sectional view of the film of FIG. 1B where a first zone of the layered structure is treated, according to one embodiment.

Similar to the film 200 of FIG. 2A, FIG. 2B illustrates a cross sectional view of a flexible film 200' that is formed by selectively treating the film 100' of FIG. 1B, according to one embodiment. The flexible film 200' includes at least one first zone 10 and at least one second zone 20. The layers 110, 120 and 110' form a layered structure that extends continuously from the at least one first zone 10 to the at least one second zone 20 along a lateral direction of the flexible film 200'. The at least one first zone 10 is positioned around a periphery of the at least one second zone 20. In the depicted embodiment, the first zone 10 is positioned to separate two adjacent second zones 20. In the at least one first zone 10, the layers 110, 120 and 110' are at least partially intermixed with each other. In the depicted embodiment, the material of the electrically insulating layers 110 and 110' is diffused into the second layer 120 upon application of at least one of heat and pressure, which results in the intermixing of the three layers 110, 120 and 11' to form the first zone 10.

In the at least one first zone 10 on the side of the second major surface 122' of the layered structure, an upper surface 12'c is formed. The upper surface 12'c is opposite the bottom surface 12a and may exhibit substantially the same properties (for example, electrically conductive, tacky, etc.) as the bottom surface 12a. For example, the upper surface 12'c may be electrically conductive due to the intermixing and the presence of electrically material from the layer 120 on the second major surface 122' in the first zone 10. In addition, the upper surface 12'c in the first zone 10 may substantially retain its ability of bonding. In the at least one second zone 20, the second major surface 122' may remain unchanged.

The film 200' can be formed in a similar manner as the film 200, for example, by selectively treating the at least one first zone 10 by applying, for example, at least one of pressure and heat, which will be described in more detail further below. In some embodiments, the layer 110' as a whole can be intermixed with the electrically conductive layer 120 upon at least one of pressure and heat, which can render the whole second major surface 122' to be electrically conductive.

In some embodiments, each of the layers 110 and 110' as a whole can be intermixed with the electrically conductive layer 120, which can render the major surfaces 122 and 122' each to be electrically conductive.

Figure 3A:
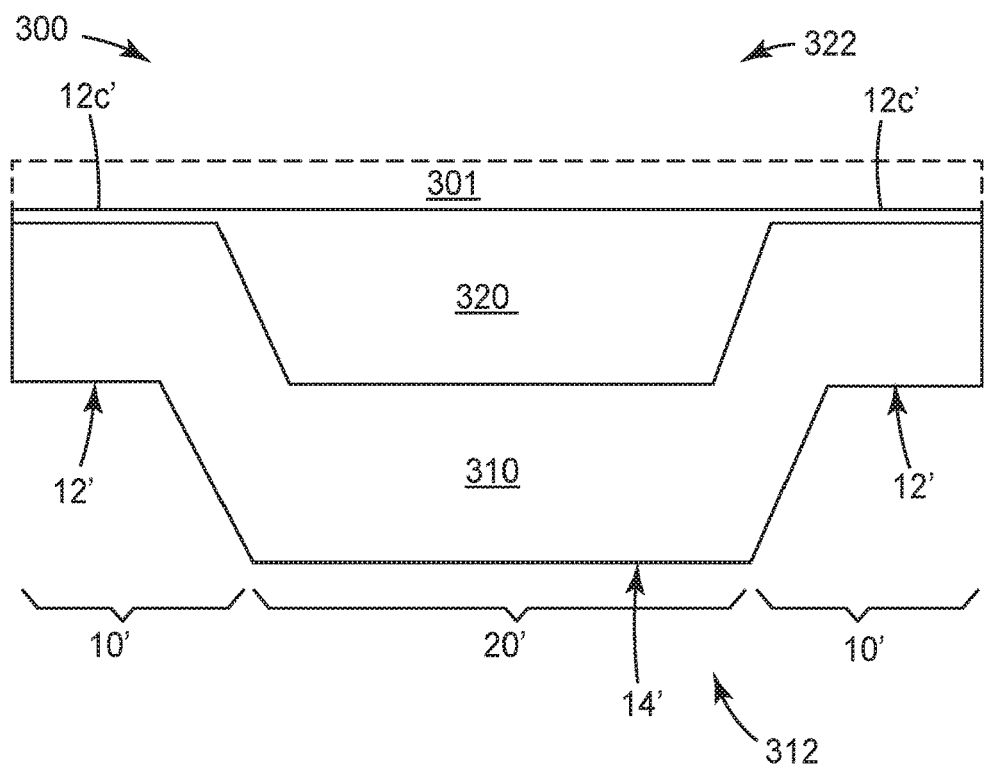
FIG. 3A is a cross sectional view of a film including a first zone and a second zone, according to another embodiment.
Figure 3B:
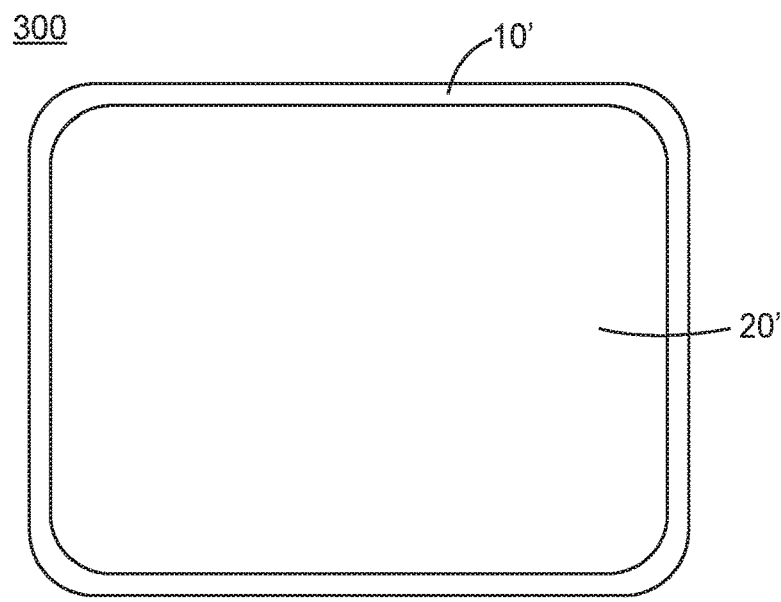
FIG. 3B is a top view of the film of FIG. 3A.
Figure 3C:
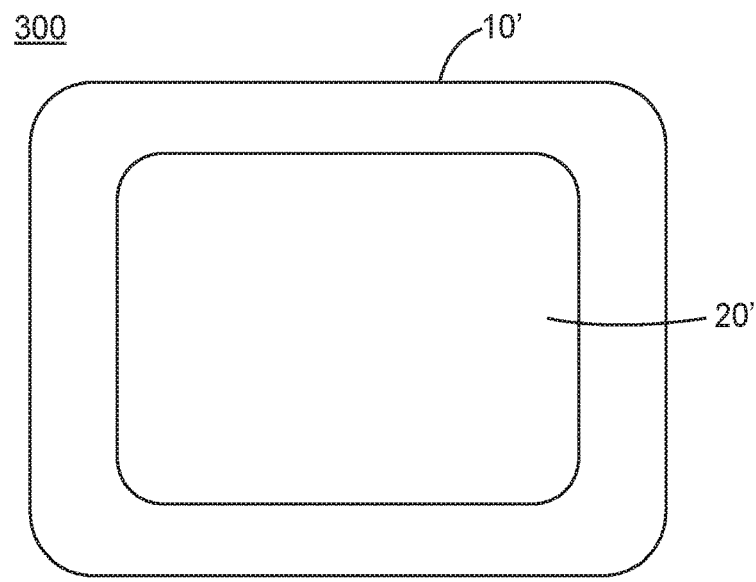
FIG. 3C is a bottom view of the film of FIG. 3B.

FIGS. 3A-C illustrate a flexible film 300 includes a first layer 310 and a second layer 320 arranged in a layered structure. The first layer 310 and the second layer 320 can have the same composition as the first and second layers 110 and 120 of FIGS. 1A-B and 2A-B, respectively. The layered structure has a first major surface 312 on the side of the first layer 310 and a second major surface 322 on the side of the second layer 320. The first and second layers 310 and 320 extend continuously from at least one first zone 10' to at least one second zone 20'. In the at least one first zone 10', the first and second layers 310 and 320 are at least partially intermixed with each other to provide an electrically conductive surface 12' on the side of the first major surface 312 of the layered structure. In the at least one second zone 20', the first major surface 312 remain electrically non-conductive (e.g., referring to the surface area 14'). In the depicted embodiment, the second zone 20 is surrounded by the first zone 10.

In the at least one first zone 10' on the side of the second major surface 322 of the layered structure, an upper surface 12c' is formed. The upper surface 12c' is opposite the bottom surface 12' and may exhibit substantially the same properties (for example, electrically conductive, tacky, etc.) as the bottom surface 12'. For example, the upper surface 12c' may be capable of bonding to a metal surface due to the diffusion of material from the first layer 310 onto the second major surface 322 in the first zone 10'. In addition, the upper surface 12c' in the first zone 10' may substantially retain its electrical conductivity. It is to be understood that the bottom surface 12 and the upper surface 12c' in the first zones 10' may have different surface profiles and/or areas. In the at least one second zone 20', the second major surface 322 may remain unchanged. FIGS. 3B and 3C illustrate top and bottom views of the film 300, respectively.

In some embodiments, one or more optional layers 301 can be disposed on top of the flexible film 300. The optional layers 301 can include, for example, one or more of a conductive foil or fabric, a fabric layer, a plastic layer, a black color layer, etc.

Figure 3D:
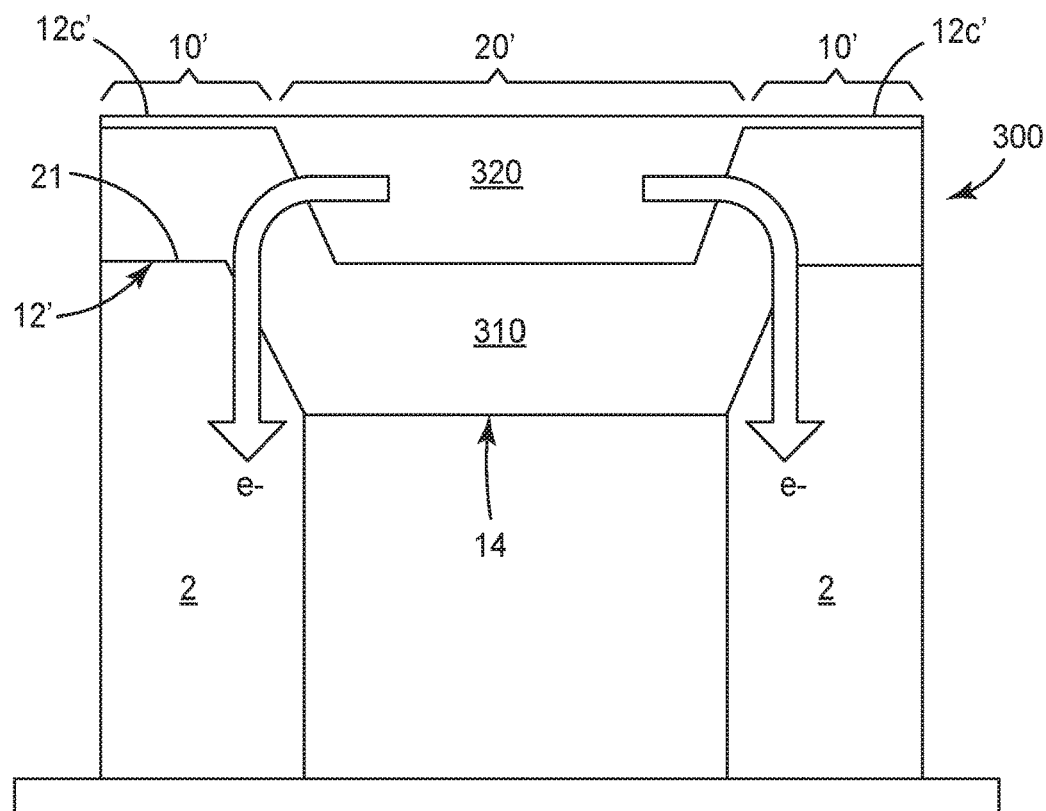
FIG. 3D is a cross sectional view of a system including the film of FIG. 3A as a lid disposed on the top of a fence on a circuit board, according to one embodiment.

FIG. 3D illustrates applying the film 300 onto a top of an electrically conductive fence 2 disposed on a circuit board 4. The fence 2 may take the form of, for example, a metal enclosure attached to the circuit board 4 which can be, for example, a printed circuit board (PCB). The fence 2 can be attached to the circuit board 4 using, for example, solder. The fence 2 may be electrically connected to a different second electrically conductive trace (not shown) on the circuit board 4 which can be, for example, a ground trace. The fence 2 includes a top surface 21 which is in direct contact with the electrically conductive surface 12' in the first zone 10' of the film 300 (see FIGS. 3A and 3D). In the depicted embodiment, the top surface 21 of the fence 2 has a surface profile, and the electrically conductive surface 12' in the first zone 10' of the film 300 has a profile following that of the top surface 21 of the fence 2. The matched profiles can increase the contact area therebetween, which in turn can enhance the bonding and electrical connection therebetween. In the depicted embodiment, when the film 300 is directly bonded to the top of the fence 2, electrically conductive paths as indicated by the arrows can be obtained between the second layer 320 in the second zone 20' and the fence 2.

The film 300 can be attached to the top of the fence 2 by, for example, applying at least one of heat or pressure. In some embodiments, the at least one first zone 10' can be treated by heat at a temperature, for example, no less than 80° C., no less than 100° C., no less than 120° C., or no less than 130° C. The heat may be applied at a temperature, for example, no greater than 200° C., no greater than 180° C., or no greater than 160° C. In some embodiments, the pressure applied can be in the range, for example, from several psi to several tens psi. It is to be understood that the film 300 can be directly bonded to the top of the fence at temperatures lower than 80° C., or higher than 200° C., and/or at pressures lower than one psi, or higher than 100 psi. It is also to be understood that the temperature and pressure applied to treat the first zone 10' can be optimized based on many variables such as, for example, the specific materials of the first and second layers, the respective thicknesses of the layers, the initial surface profiles of the layers, the surface conditions of the top of the fence 2, etc.

Upon heat and/or pressure, the electrically conductive surface 12' in the first zone 10' can be directly bonded to the top surface 21 of the fence 2 to form an electrically conductive interface. During the process of bonding, the film 300 is capable of adjusting its surface profile to follow that of the fence 2. For example, when the top surface 21 of the fence 2 is non-flat, the thickness of the film 300 in the first zone 10' can be reduced with an appropriate amount upon heat and/or pressure to accommodate the non-flat profile.

While the depicted embodiment in FIG. 3D shows the first layer 310 is attached to the top of the fence 2, it is to be understood in other embodiments, the second layer 320 an be attached to the top of the fence 2. The surface 12c' at the second major surface 322 in the first zone 10' (see also FIG. 3A) can be directly bonded to the top of the fence 2 and obtain electrically connection therebetween.

While FIGS. 3A-D illustrate the film 300 having a dual-layer structure, it is to be understood that in some embodiments, the above description can also be applied to a film having a tri-layer structure such as the films 100' and 200' shown in FIGS. 1B and 2B.

Figure 4A:
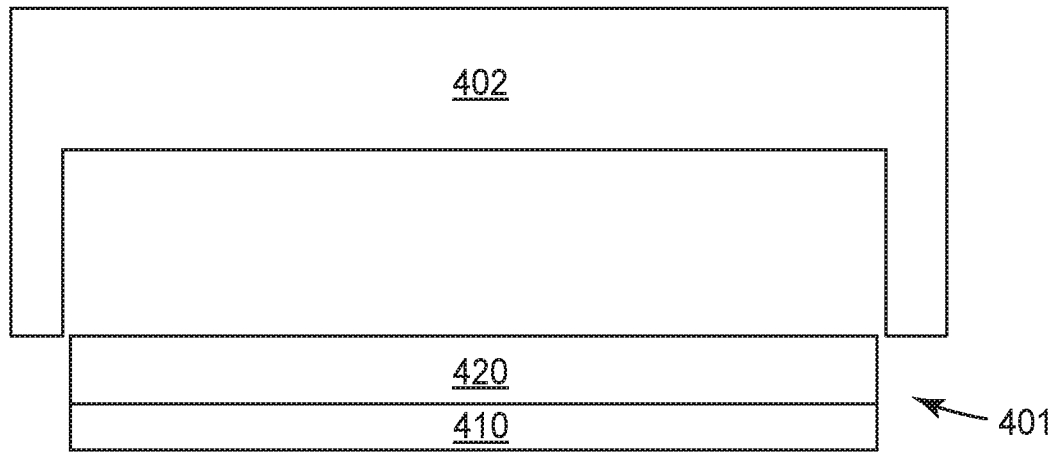
FIG. 4A is a cross sectional view of a solid lid and a film before assembling, according to one embodiment.
Figure 4B:
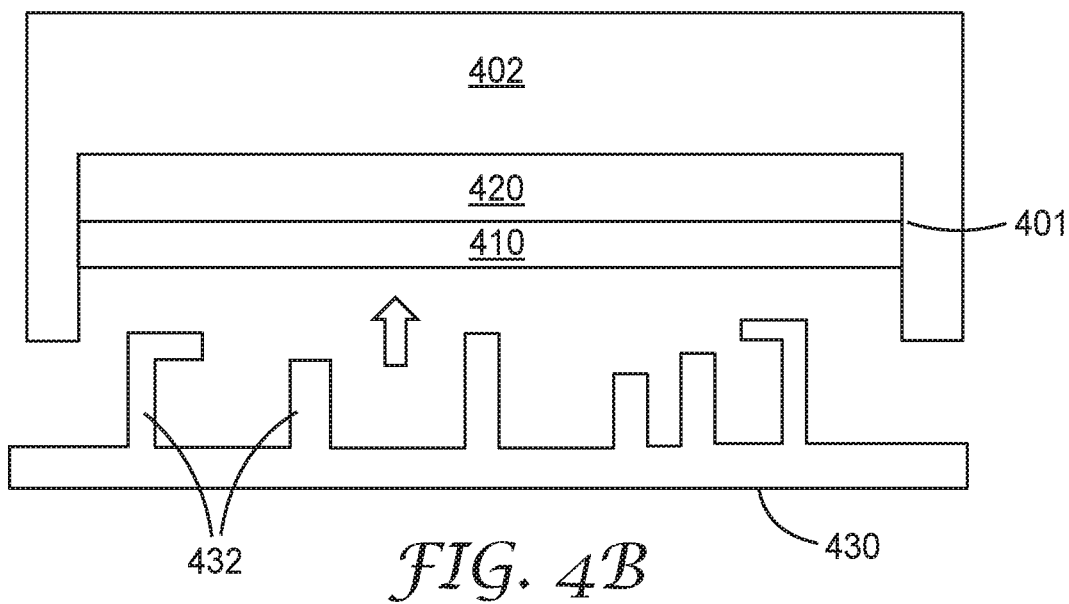
FIG. 4B is a cross sectional view of the film of FIG. 4A being treated using a tool, according to one embodiment.

FIGS. 4A-D illustrate forming a system 400, according to one embodiment. As shown in FIG. 4A, a flexible film 401 includes first and second layers 410 and 420 arranged in a layered structure. In some embodiments, the first layer 410 and the second layer 420 can have the same composition as the first and second layers 110 and 120 of FIGS. 1A-B and 2A-B, respectively. In some embodiments, the first layer 410 and the second layer 420 can have the same composition as the second and first layers 120 and 110 of FIGS. 1A-B and 2A-B, respectively. The flexible film 401 is attached to a solid lid 402. As shown in FIG. 4B, the flexible film 401 is to be pressed against a tool 430 at elevated temperatures. The tool 430 includes multiple projecting bars 432. The top portions of the projecting bars 432 can be pressed against the bottom surface 412 of the layered structure to produce multiple first zones 10" (see FIG. 4C). In the respective first zones 10", the first and second layers 410 and 420 can be intermixed with each other upon the pressure and/or heat from the bars 432 to create electrically conductive surfaces 12" in the first zones 10". In the untreated zones 20", the surface 14" may be electrically insulating. Then, the treated flexible film 401 along with the attached solid lid 402 is bonded onto a top of an electrically conductive fence 42 on a circuit board 44 by applying at least one of heat and pressure.

Figure 4C:
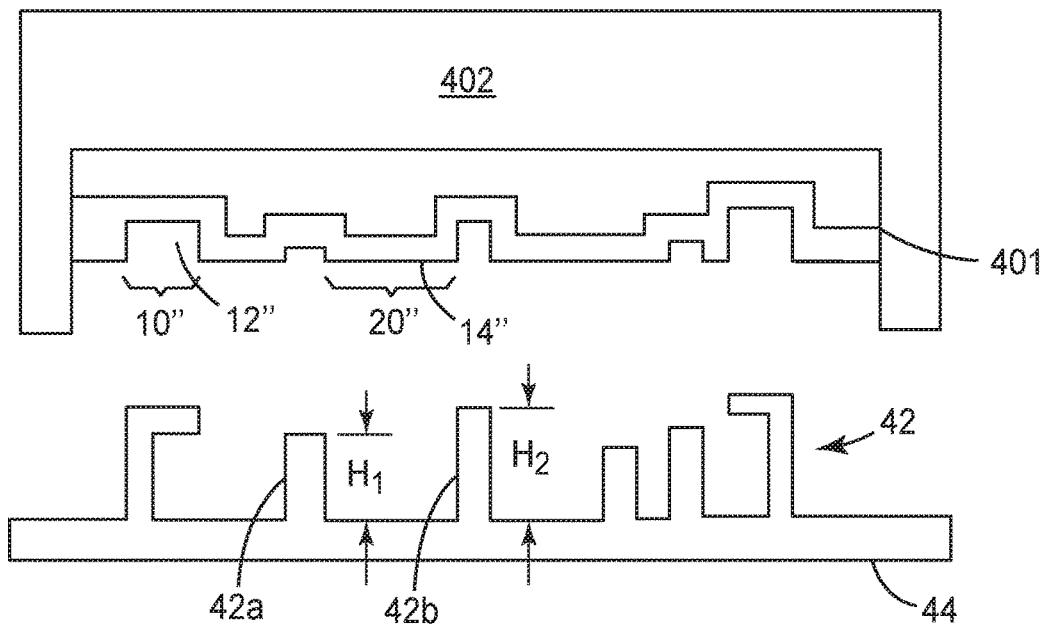
FIG. 4C is a cross sectional view of the treated film of FIG. 4B and a circuit board including a fence before assembling.
Figure 4D:
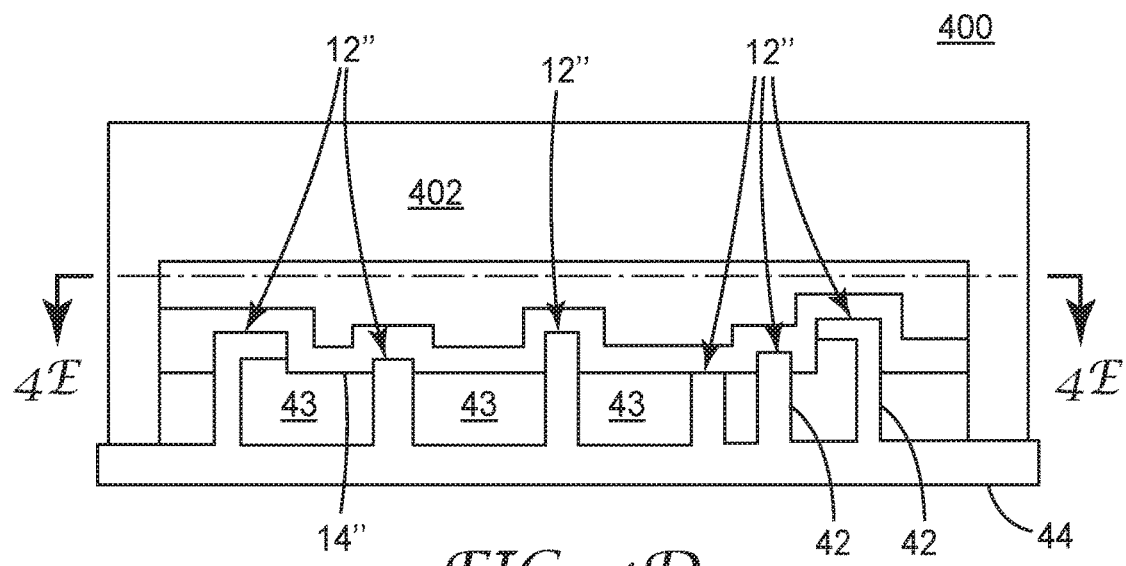
FIG. 4D is a cross sectional view of a system including the film and the circuit board of FIG. 4C.

As shown in FIG. 4C, the electrically conductive fence 42 has a first height Hi at a first portion 42a and a second height $H_2$ different from the first height Hi. In some embodiments, the difference between $H_1$ and $H_2$ can be, for example, 1 mm or more, 2 mm or more, 3 mm or more, or 5 mm or more. The tool 430 of FIG. 4B has the height profile and top surface profile of the projecting bars 432 matching that of different portions (e.g., 42a and 42b) of the electrically conductive fence 42. In this manner, when the treated film 401 is bonded to the top of the electrically conductive fence 42 as shown in FIGS. 4C-D, the bottom surface 12" in the first zones 10" can have a profile that accommodates the different heights such as $H_1$ and $H_2$. In a bonding process by applying at least one of pressure and heat when the flexible film 401 is disposed on the top of the fence 42, the material of the first layer 410 can flow to bond to the top surface of the fence 42, while providing an electrically conductive surface 12" in direct contact to the top surface of the fence 42.

The electrically conductive fence 42 include multiple portions (e.g., 42a and 42b) that form multiple enclosures 43 each to accommodate one or more electronic devices (not shown) disposed on the circuit board 44. The enclosures 43 are covered by the flexible film 401. The first zones 10" of the flexible film 401 are bonded to and in electrically contact with the respective tops of the multiple portions of the fence 42. When the first layer 410 is an electrically insulating layer and the second layer 420 is an electrically conductive layer, the bottom surface 12" in the first zones 10" is electrically conductive, while in the second zones 20" the bottom surface 14" is electrically insulating. The electrically insulating surface 14" in the untreated zones 20" faces the underlying electronic devices (not shown) received by the enclosures 43. In some embodiments, the solid lid 402 can be optional and can be removed from the circuit board 44 after the flexible film 401 is bonded to the fence 42.

Figure 4E:
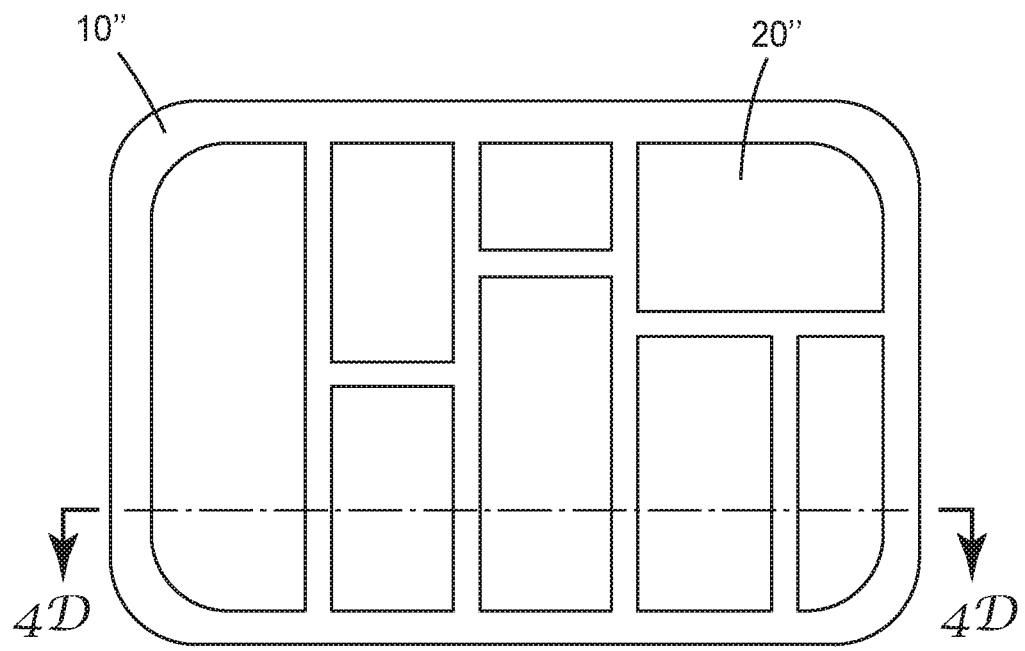
FIG. 4E is a cross sectional top view of the system of FIG. 4D.

FIG. 4E shows a top view of FIG. 4D, showing the treated zones 10" of intermixing on the fence regions. The relative height of the fence can vary in comparison to the substrate of the circuit board 44 which the fence 42 is attached or protruding from, or in some cases, recessed into the substrate. The fence 42 is an electrically conductive structure that allows for grounding of the flexible film 401 after intermixing in the intermixing zones 10". In some embodiments, the fence height may be "flush" or even below or recessed below a primary surface of the substrate of the circuit board 44. The flexible film 401 can be used to attach to a fence that include both protruding, flush and/or recessed portions of a fence design. A fence (e.g., the fence 42) defines a boundary that is used for the intermixing zones 10" to ground to. In some cases, the fence or a portion of the fence may be a portion of a PCB ground plane that is exposed and that an intermixing zone (e.g., the zone 10") can connect too.

Figure 5A:
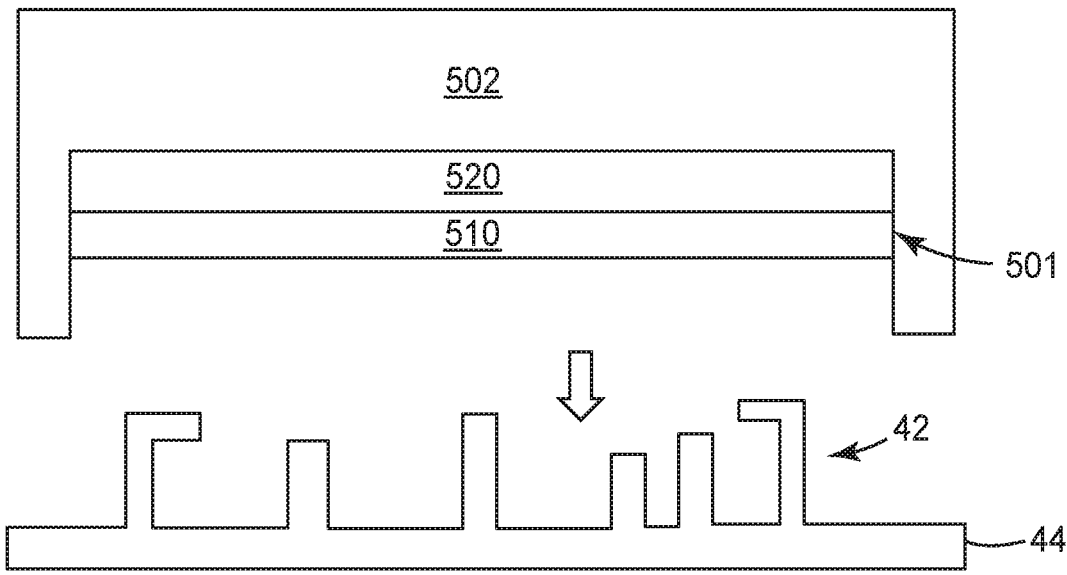
FIG. 5A is a cross sectional view of a system including a film and a fence disposed on a circuit board before assembling, according to one embodiment.
Figure 5B:
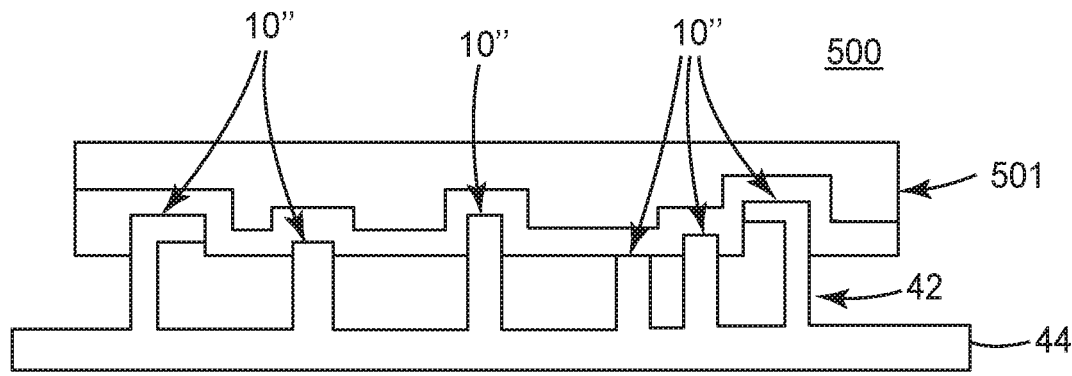
FIG. 5B is a cross sectional view of the system of FIG. 5A where the film is attached to the top of the fence.

FIGS. 5A and 5B illustrate forming a system 500 without using the tool 430 including the hot projecting bars of FIG. 4B. As shown in FIG. 5A, a flexible film 501 include a first layer 510 and a second layer 520 arranged in a layered structure. In some embodiments, the first layer 510 and the second layer 520 can have the same composition as the first and second layers 110 and 120 of FIGS. 1A-B and 2A-B, respectively. In some embodiments, the first layer 510 and the second layer 520 can have the same composition as the second and first layers 120 and 110 f FIGS. 1A-B and 2A-B, respectively. The flexible film 501 is attached to a forming tool 502. Then, the flexible film 501 is directly bonded to the top of the electrically conductive fence 42 that is secured on the circuit board 44. In a bonding process, at least one of pressure and heat can be applied when the flexible film 501 is disposed on the top of the fence 42, and the material of the flexible film 501 in the treated zones can flow to bond to the top surface of the fence 42, while providing an electrically conductive surface 10" in direct contact to the top surface of the fence 42. As shown in FIG. 5B, the treated zones 10" may reduce the respective thicknesses with varying amounts to accommodate the height difference of the fence 42. After the bonding, the forming tool 502 is removed.

Figure 6A:
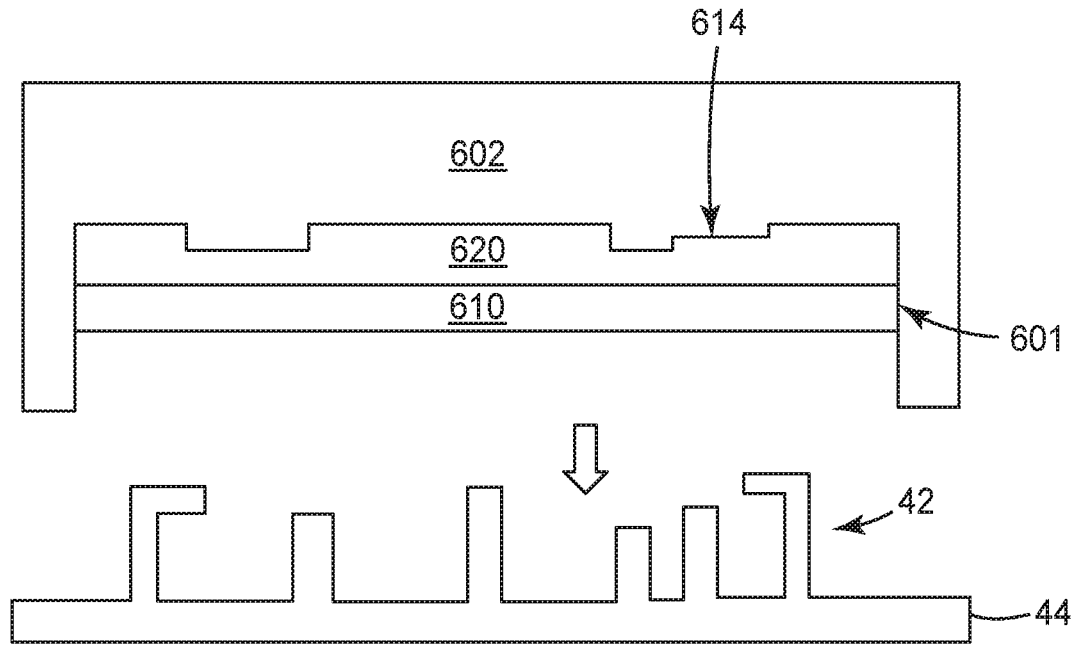
FIG. 6A is a cross sectional view of a system including a film and a fence disposed on a circuit board before assembling, according to one embodiment.
Figure 6B:
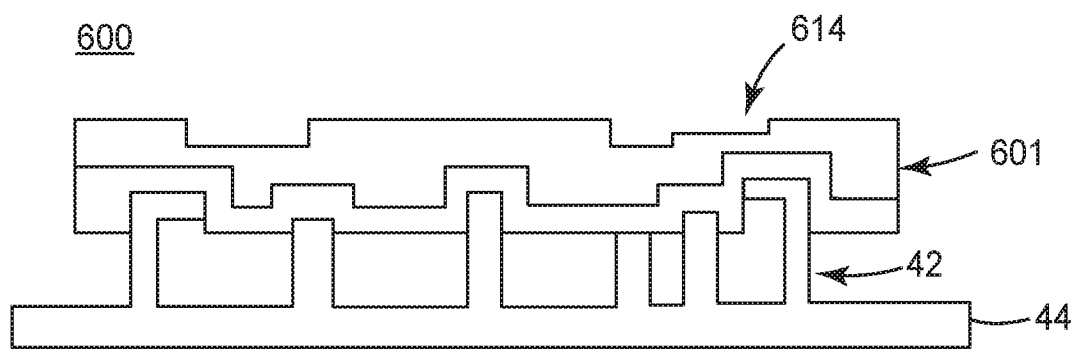
FIG. 6B is a cross sectional view of the system of FIG. 6A where the film is attached to the top of the fence.

FIGS. 6A-B illustrate forming a system 600 by preshaping the top surface 614 of a flexible film 601. As shown in FIG. 6A, the flexible film 601 include a first layer 610 and a second layer 620 arranged in a layered structure. In some embodiments, the first layer 610 and the second layer 620 can have the same composition as the first and second layers 110 and 120 of FIGS. 1A-B and 2A-B, respectively. In some embodiments, the first layer 610 and the second layer 620 can have the same composition as the second and first layers 120 and 110 of FIGS. 1A-B and 2A-B, respectively. As shown in FIG. 6A, the top surface 614 of flexible film 601 is attached to a major surface of a forming tool 602. The major surface of the forming tool 602 has a profile that is complementary to the height profile of the top of the electrically conductive fence 42. By attaching to the major surface of the forming tool 602 under heat and/or pressure, the flexible film 601 has its top surface 614 to be shaped. Then, the flexible film 601 is directly bonded to the top of the electrically conductive fence 42 that is secured on the circuit board 44. In a bonding process, at least one of pressure and heat can be applied when the flexible film 601 is disposed on the top of the fence 42, and the material of the flexible film 601 in the zones applied pressure and/or heat can flow to bond to the top surface of the fence 42, while providing an electrically conductive surface in direct contact to the top surface of the fence 42. After the bonding, the forming tool 602 is removed.

While FIGS. 4A through 6B illustrate the films 401, 501 and 601 each having a dual-layer structure, it is to be understood that in some embodiments, the above description can also be applied to a film having a tri-layer structure such as the films 100' and 200' shown in FIGS. 1B and 2B.

Various unexpected results and advantages are obtained in exemplary embodiments of the disclosure. One such advantage of exemplary embodiments of the present disclosure is that flexible films provide electrically conductive bottom surfaces in treated zones that is capable of bonding to the top of an electrically conductive fence, which can substantially eliminate any bond-line gaps therebetween and provide efficient EMI shielding. In addition, in untreated zones, the bottom surfaces can be electrically insulating and prevent short-circuit problems.

The EMI shielding in a bond-line gap may be directly related to the degree of intermixing or inter-diffusion of the conductive material of the second layer and the non-conductive material of the first layer in the intermixing zone. The degree of EMI shielding can be tailored to the end use application and can be adjusted by the degree of intermixing/inter-diffusion in the desired zones. The EMI shielding effect may also be related to the level of contact the conductive material of the second layer makes to the desired fence area in the intermixing zones.

In an EMI shielding test method measuring the EMI shielding through intermixing zones (e.g., bond-line intermixing zones in direct contact with the top of a fence) the EMI shielding can be at least 20 dB, preferably 30 dB, more preferably 40 dB or most preferably greater than 50 dB or more based on the degree on intermixing in the desired zones and the type of conductive materials used in the conductive layer.

The EMI shielding of the flexible film in a shield can lid attachment design can be measured through the thickness of the electrically conductive layer and also through the intermixing zones. In some cases, the EMI Shielding effectiveness is the same or different based on the degree of intermixing in the zones treated with heat and/or pressure. When the top side of the flexible film has an optional metal layer applied, the primary EMI shielding leakage may most likely occur in the intermixing zones which would be otherwise bond-line gap regions. The degree of intermixing and the resultant grounding contact resistance can be tailored to meet the end use application specification needs by selection of the conductive layer material type (e.g., density, electrical conductivity, thickness, fiber dimensions, and optionally added electrically conductive fillers such as conductive particles, flakes and/or fibers, etc.) that could in some examples be effectively thicker (longer path) of conductive material.

The contact resistance of the electrically conductive layer to the top of a fence in an intermixing region can vary based on the degree of intermixing desired. The contact resistance can be, for example, less than 100 ohms, preferably less than 20 ohms, more preferably less than 1 ohms and most preferably less than 0.1 ohms. The contact resistance can be measured by a test method that utilizes a 2 point contact resistance probe test method between the fence region near the intermixing zone and a location near this zone of the electrically conductive layer.

It is to be understood that the fence material may have self-resistance (e.g., an inherent surface resistance) that can affect the measured contact resistance. The surface resistance may be related to the material type and oxide layer thickness. In some embodiments, contact resistance values can be measured based on a stainless steel surface with a thin oxide layer, and a contact resistance measurement of the stainless steel fence surface alone may be, for example, less than 0.2 ohms. The thickness of oxide layers and metal types need to be considered to adjust the baseline contact resistance of the metal surfaces and adjust the contact resistance ranges.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Listing of Exemplary Embodiments

It is to be understood that any one of embodiments 1-18, 19-28, and 29-34 can be combined.

Embodiment 1 is a flexible film comprising:
  an electrically conductive layer, and first and second electrically insulating layers, the electrically conductive layer being sandwiched by the first and second electrically insulating layers in a layered structure, the layered structure having a first major surface on the side of the first electrically insulating layer and a second major surface on the side of the second electrically insulating layer opposite the first major surface,
  the layered structure extending continuously from at least one first zone to at least one second zone along a lateral direction of the flexible film, and the at least one first zone being positioned around a periphery of the respective at least one second zone, and
  in the at least one first zone the electrically conductive layer and the first and second electrically insulating layers being at least partially intermixed with each other to provide an electrically conductive surface in the at least one first zone on the side of the first major surface of the layered structure, and in the at least one second zone the first major surface remaining electrically non-conductive.

Embodiment 2 is the flexible film of embodiment 1, wherein the layered structure has a thinner thickness in the at least one first zone than the respective at least one second zone.

Embodiment 3 is the flexible film of embodiment 1 or 2, wherein the electrically conductive surface in the at least one first zone on the side of the first major surface is electrically connected to the electrically conductive layer.

Embodiment 4 is the flexible film of any one of embodiments 1-3, wherein the layered structure in the at least one first zone is flowable and bondable to a metal surface upon at least one of heat and pressure.

Embodiment 5 is the flexible film of any one of embodiments 1-4, wherein at least one of the first and second electrically insulating layers is a thermoplastic layer.

Embodiment 6 is the flexible film of any one of embodiments 1-5, wherein at least one of the first and second electrically insulating layers is a thermosetable layer.

Embodiment 7 is the flexible film of embodiment 6, wherein the thermosetable layer includes epoxy.

Embodiment 8 is the flexible film of any one of embodiments 1-7, wherein at least one of the first and second electrically insulating layers is a curable layer.

Embodiment 9 is the flexible film of embodiment 8, wherein at least one of the first and second electrically insulating layers is curable by one or more of heat, UV, moisture, and pressure.

Embodiment 10 is the flexible film of any one of embodiments 1-9, wherein the electrically conductive layer comprises an electrically conductive non-woven material.

Embodiment 11 is the flexible film of embodiment 10, wherein the electrically conductive non-woven material comprises a plurality of electrically conductive fibers.

Embodiment 12 is the flexible film of embodiment 11, wherein the plurality of electrically conductive fibers comprise a plurality of electrically insulating fibers coated with an electrically conductive material.

Embodiment 13 is the flexible film of any one of embodiments 1-12, further comprising a fourth layer disposed on at least one of the first and second major surfaces of the layered structure.

Embodiment 14 is the flexible film of embodiment 13, wherein the fourth layer is an electrically conductive layer.

Embodiment 15 is the flexible film of embodiment 14, wherein the electrically conductive layer comprises a metal coating.

Embodiment 16 is the flexible film of embodiment 13, wherein the fourth layer is an electrically insulating layer.

Embodiment 17 is the flexible film of any one of embodiments 1-16, wherein the at least one first zone comprises a plurality of first zones, the plurality of first zones have the same or different thicknesses.

Embodiment 18 is the flexible film of any one of embodiments 1-17, wherein the at least one second zone comprises a plurality of second zones that are separated by at least one of the first zone.

Embodiment 19 is a system comprising:
  an electrically conductive fence disposed on and projecting from a major surface of a circuit board, the electrically conductive fence at least partially surrounding one or more of electronic components on the circuit board, the electrically conductive fence being connected to a different second electrically conductive trace of the circuit board; and
  a flexible film disposed on a top of the electrically conductive fence, and facing the major surface of the circuit board, the flexible film comprising:
    an electrically conductive layer, and first and second electrically insulating layers, the electrically conductive layer being sandwiched by the first and second electrically insulating layers in a layered structure, the layered structure having a first major surface on the side of the first electrically insulating layer and a second major surface on the side of the second electrically insulating layer opposite the first major surface, the layered structure extending continuously from at least one first zone to at least one second zone along a lateral direction of the flexible film, and the at least one first zone being positioned around a periphery of the respective at least one second zone, and in the at least one first zone the electrically conductive layer and the first and second electrically insulating layers being at least partially intermixed with each other to provide an electrically conductive surface in the at least one first zone on the side of the first major surface of the layered structure, and in the at least one second zone the first major surface remaining electrically non-conductive, wherein the at least one first zone of the flexible film is directly bonded to the top of the electrically conductive fence.

Embodiment 20 is the system of embodiment 19, wherein the first electrically conductive trace is a signal trace and the second electrically conductive trace is a ground trace.

Embodiment 21 is the system of embodiment 19 or 20, wherein the electrically conductive fence has a first height at a first portion, and a second height at a second portion, the first and second heights are different, and the bottom surface of the flexible film in the at least one first zone has a profile that accommodates the different first and second heights.

Embodiment 22 is the system of embodiment 21, wherein the second major surface of the layered structure is substantially flat.

Embodiment 23 is the system of embodiment 21, wherein the second major surface of the layered structure is non-flat and has a profile in the first zone following the profile of the first major surface.

Embodiment 24 is the system of any one of embodiments 19-23, wherein the top of the electrically conductive fence includes a non-flat surface.

Embodiment 25 is the system of any one of embodiments 19-24, wherein the first electrically insulating layer is a bottom layer facing the circuit board.

Embodiment 26 is the system of any one of embodiments 19-25, wherein the second electrically insulating layer is a bottom layer facing the circuit board.

Embodiment 27 is the system of any one of embodiments 19-26, wherein the at least one first zone comprises a plurality of first zones, each of the first zones has a bottom surface attached to the respective tops of different portions of the electrically conductive fence.

Embodiment 28 is the system of any one of embodiments 19-27, wherein the at least one second zone comprises a plurality of second zones that are separated by at least one of the first zone, and each of the second zones covers the respective spaces of the circuit board that are at least partially enclosed the electrically conductive fence.

Embodiment 29 is a method of making a flexible film, the method comprising:

arranging a first electrically insulating layer, an electrically conductive layer, and a second electrically insulating layer in a layered structure, the electrically conductive layer being sandwiched by the first and second electrically insulating layers, the layered structure having a first major surface on the side of the first electrically insulating layer and a second major surface on the side of the second electrically insulating layer opposite the first major surface;

selectively treating at least one first zone of the layered structure such that the electrically conductive layer and the first and second electrically insulating layers are at least partially intermixed with each other in the least one first zone to provide an electrically conductive surface in the at least one first zone on the side of the first major surface of the layered structure, and in the at least one second zone the first major surface being electrically non-conductive, wherein the layered structure extends continuously from the at least one first zone to at least one second zone along a lateral direction of the flexible film, and the at least one first zone is positioned around a periphery of the respective at least one second zone.

Embodiment 30 is the method of embodiment 29, wherein selectively treating the at least one first zone comprises applying at least one of pressure and heat onto the layered structure in the at least one first zone.

Embodiment 31 is the method of embodiment 29 or 30, wherein selectively treating the at least one first zone comprises thermal-embossing the layered structure in the at least one first zone.

Embodiment 32 is the method of any one of embodiments 29-31, wherein thermal-embossing the at least one first zone comprises applying a pre-former tool to press against a bottom surface of the flexible film in the at least one first zone.

Embodiment 33 is the method of any one of embodiments 29-32, wherein selectively treating the at least one first zone comprises pressing the first major surface in the at least one first zone against a top of an electrically conductive fence on a circuit board.

Embodiment 34 is the method of any one of embodiments 29-33, wherein selectively treating at least one first zone of the layered structure reduces the thickness thereof It is to be understood that any one of embodiments 1'-18', 19'-28', and 29'-34' can be combined.

Embodiment 1' is a flexible film comprising:

a first layer and a second layer arranged in a layered structure, the layered structure having a first major surface on the side of the first layer and a second major surface on the side of the second layer opposite the first major surface, the first layer being electrically insulating, and the second layer being electrically conductive, the first and second layers extending continuously from at least one first zone to at least one second zone along a lateral direction of the flexible film, and the at least one first zone being positioned around a periphery of the respective at least one second zone, and in the at least one first zone the first and second layers being at least partially intermixed with each other to provide an electrically conductive surface in the at least one first zone on the side of the first major surface of the layered structure, and in the at least one second zone the first major surface remaining electrically non-conductive.

Embodiment 2' is the flexible film of embodiment 1', wherein the layered structure has a thinner thickness in the at least one first zone than the respective at least one second zone.

Embodiment 3' is the flexible film of embodiment 1' or 2', wherein the electrically conductive surface in the at least one first zone on the side of the first major surface is electrically connected to the second layer.

Embodiment 4' is the flexible film of any one of embodiments 1'-3', wherein the layered structure in the at least one first zone is flexible and bondable to a metal surface upon at least one of heat and pressure.

Embodiment 5' is the flexible film of any one of embodiments 1'-4', wherein the first layer is a thermoplastic layer.

Embodiment 6' is the flexible film of any one of embodiments 1'-5', wherein the first layer is a thermoset layer.

Embodiment 7' is the flexible film of embodiment 6', wherein the thermosetable layer includes epoxy.

Embodiment 8' is the flexible film of any one of embodiments 1'-7', wherein the first layer is a curable layer.

Embodiment 9' is the flexible film of embodiment 8', wherein the first layer is curable by one or more of heat, UV, moisture, and pressure.

Embodiment 10' is the flexible film of any one of embodiments 1'-9', wherein the second layer comprises one or more of an electrically conductive non-woven material and an electrically conductive woven material.

Embodiment 11' is the flexible film of embodiment 10', wherein the electrically conductive non-woven material comprises a plurality of electrically conductive fibers.

Embodiment 12' is the flexible film of embodiment 11', wherein the plurality of electrically conductive fibers comprise a plurality of electrically insulating fibers coated with an electrically conductive material.

Embodiment 13' is the flexible film of any one of embodiments 1'-12', further comprising a third layer disposed on at least one of the first and second major surfaces of the layered structure.

Embodiment 14' is the flexible film of embodiment 13', wherein the third layer is an electrically conductive layer.

Embodiment 15' is the flexible film of embodiment 14', wherein the electrically conductive layer comprises a metal coating.

Embodiment 16' is the flexible film of embodiment 13', wherein the third layer is an electrically insulating layer.

Embodiment 17' is the flexible film of any one of embodiments 1'-16', wherein the at least one first zone comprises a plurality of first zones, the plurality of first zones have the same or different thicknesses.

Embodiment 18' is the flexible film of any one of embodiments 1'-17', wherein the at least one second zone comprises a plurality of second zones that are separated by at least one of the first zone.

Embodiment 19' is a system comprising:
an electrically conductive fence disposed on and projecting from a major surface of a circuit board, the electrically conductive fence at least partially surrounding one or more of electronic components on the circuit board, the electrically conductive fence being connected to a different second electrically conductive trace of the circuit board; and
a flexible film disposed on a top of the electrically conductive fence, and facing the major surface of the circuit board, the flexible film comprising:
a first layer and a second layer arranged in a layered structure, the layered structure having a first major surface on the side of the first layer and a second major surface on the side of the second layer opposite the first major surface, the first layer being electrically insulating, and the second layer being electrically conductive,
the first and second layers extending continuously from at least one first zone to at least one second zone along a lateral direction of the flexible film, and the at least one first zone being positioned around a periphery of the respective at least one second zone, and
in the at least one first zone the first and second layers being at least partially intermixed with each other to provide an electrically conductive surface in the at least one first zone on the side of the first major surface of the layered structure, and in the at least one second zone the first major surface being electrically non-conductive,
wherein the at least one first zone of the flexible film is directly bonded to the top of the electrically conductive fence.

Embodiment 20' is the system of embodiment 19', wherein the first electrically conductive trace is a signal trace and the second electrically conductive trace is a ground trace.

Embodiment 21' is the system of embodiment 19' or 20', wherein the electrically conductive fence has a first height at a first portion, and a second height at a second portion, the first and second heights are different, and the bottom surface of the flexible film in the at least one first zone has a profile that accommodates the different first and second heights.

Embodiment 22' is the system of embodiment 21', wherein the second major surface of the layered structure is substantially flat.

Embodiment 23' is the system of embodiment 21', wherein the second major surface of the layered structure is non-flat and has a profile in the first zone following the profile of the first major surface.

Embodiment 24' is the system of any one of embodiments 19'-23', wherein the top of the electrically conductive fence includes a non-flat surface.

Embodiment 25' is the system of any one of embodiments 19'-24', wherein the first layer is a bottom layer facing the circuit board.

Embodiment 26' is the system of any one of embodiments 19'-25', wherein the second layer is a bottom layer facing the circuit board.

Embodiment 27' is the system of any one of embodiments 19'-26', wherein the at least one first zone comprises a plurality of first zones, each of the first zones has a bottom surface attached to the respective tops of different portions of the electrically conductive fence.

Embodiment 28' is the system of any one of embodiments 19'-27', wherein the at least one second zone comprises a plurality of second zones that are separated by at least one of the first zone, and each of the second zones covers the respective spaces of the circuit board that are at least partially enclosed the electrically conductive fence.

Embodiment 29' is a method of making a flexible film, the method comprising:
arranging a first layer and a second layer in a layered structure, the layered structure having a first major surface on the side of the first layer and a second major surface on the side of the second layer opposite the first major surface, the first layer being electrically insulating, and the second layer being electrically conductive;
selectively treating at least one first zone of the layered structure such that the first and second layers are at least partially intermixed with each other in the least one first zone to provide an electrically conductive surface in the at least one first zone on the side of the first major surface of the layered structure, and in the at least one second zone the first major surface being electrically non-conductive,
wherein the first and second layers extend continuously from the at least one first zone to at least one second zone along a lateral direction of the flexible film, and the at least one first zone is positioned around a periphery of the respective at least one second zone.

Embodiment 30' is the method of embodiment 29', wherein selectively treating the at least one first zone comprises applying at least one of pressure and heat onto the layered structure in the at least one first zone.

Embodiment 31' is the method of embodiment 29' or 30', wherein selectively treating the at least one first zone comprises thermal-embossing the layered structure in the at least one first zone.

Embodiment 32' is the method of any one of embodiments 29'-31', wherein thermal-embossing the at least one first zone comprises applying a pre-former tool to press against a bottom surface of the flexible film in the at least one first zone.

Embodiment 33' is the method of any one of embodiments 29'-32', wherein selectively treating the at least one first zone comprises pressing the first major surface in the at least one first zone against a top of an electrically conductive fence on a circuit board.

Embodiment 34' is the method of any one of embodiments 29'-33', wherein selectively treating at least one first zone of the layered structure reduces the thickness thereof.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Materials
1. FR-4-type printed circuit board (PCB); 46 mm wide×75 mm long and 1.5 mm thick, having 17 gold plated copper traces, 1.2 mm wide, spaced 1.2 mm apart, with a height of 18 microns (½ oz. Cu).
2. Insulating films and conductive nonwoven films (see Table A)

TABLE A

| Insulating and conductive nonwoven films used in examples | | | | |
| --- | --- | --- | --- | --- |
| Conductive Non-woven | type | thickness | manufacturer | Surface Resistivity |
| TN-WB-14-PCN | Ni/Cu/Ni/PET | 30 micron | Tiannuo Photoelectric Material Co. | <.07 ohms/1" square [1] |
| Optimat 20404E | Ni/Carbon | 100 micron | Technical Fibre Products, Ltd. | 2.0 ohms/square [2] |
| Optiveil 20444 B | Ni/Cu/Carbon | 75 micron | Technical Fibre Products, Ltd. | 0.6-1.25 ohms/square [2] |
| Insulating Layer Materials | type | thickness | manufacturer | Material class |
| 3M™ Thermal Bonding Film 615 | polyester thermoplastic | 50 micron | 3M Company (Saint Paul, MN, USA) | Thermoplastic |
| 3M™ Thermal Bonding Film 668 | polyamide thermoplastic | 50 micron | 3M Company (Saint Paul, MN, USA) | Thermoplastic |
| 3M™ Thermal Bonding Film 406 | ethylene acrylic acid copolymer | 50 micron | 3M Company (Saint Paul, MN, USA) | Thermoplastic |
| Griltex D2279E | Copolyester | ~100 micron | EMS Griltech | Thermoplastic |
| Griltex 9E-GF | Copolyester | ~100 micron | EMS Griltech | Thermoplastic |
| Riteflex 425 | Polyester | ~100 micron | Celanese | Thermoplastic |
| Admer SE810 | Polyolefin | ~100 micron | Mitsubishi Chemical | Thermoplastic |
| Dynapol S-1401 | Copolyester | ~100 micron | Evonik | Thermoplastic |
| Elvax 420 | EVA | ~100 micron | DuPont | Thermoplastic |
| 3M™ Anisotropic Conductive Film 7303 | epoxy/acrylate thermoset | 75 micron | 3M Company (Saint Paul, MN, USA) | Thermosetable |
| 3M™ Adhesive Transfer Tape 467MP | firm acrylic pressure sensitive adhesive | 50 micron | 3M Company (Saint Paul, MN, USA) | Pressure Sensitive Adhesive |
| 3M™ 300LSE Adhesive Transfer Tape | acrylic pressure sensitive adhesive | 50 micron | 3M Company (Saint Paul, MN, USA) | Pressure Sensitive Adhesive |

[1] Supplier specification. Measured by suppliers test method ZY9987
[2] Supplier technical data. Measured using a Vermason 75 mm contact block, 1.0 kg dead load, 10 cm × 10 cm sample size.

Preparation of Thermoplastic Films

Commercially available films/adhesives from 3M were used as received.

Other thermoplastic films were prepared as follows:
1. Thermoplastic films were prepared using a lab benchtop coater/laminator equivalent to commercially available instrument from ChemInstruments as model HLCL-1000Hot Melt Laboratory Coater Laminator. The heated bed for this coater/laminator is equipped with a heated, 9 inch (22.9 cm) wide notch bar coater, having a 10 mil (0.25 mm) gap. The bed and knife temps were set at about 250° F. (121° C.). A heat gun was used to expedite melting of the samples.
2. The collected extrudate was placed between two silicone release liners, 3 mil (0.076 mm) thick each, which were placed on the bed of the coater.
3. The material was heated on the coater to at least 200° C.
4. Once the extrudate had melted, the resin and liners were pulled through the notch bar gap, producing a film sample 16 inch (40.6 cm)×9 inch (22.9 cm) with a thickness of 4 mils (0.10 mm).

Preparation of 2 Layer Constructions
1. Thermoplastic Films: Layer one sheet of thermoplastic or thermosetting film and one sheet of conductive non-woven material between release liner paper. Heat press on a Young Technology Precision Thermal Press model TPC3000 set at 250° F. (121° C.), 30 PSI gauge pressure, 30 seconds.
2. Thermosetting and pressure sensitive adhesive transfer tapes: Apply one layer of conductive non-woven sheet material to one layer of pressure sensitive adhesive transfer tape and laminate with a 4.5 lb (2.04 kg) rubber roller using 2 passes of the roller in each direction.

Preparation of Electrical Test Samples
1. Cut a 5 mm×46 mm piece of the two layer material.
2. Place the piece of material across the width of the FR4 printed circuit board such that the material covers all 17 circuit traces. Material is placed with insulating side against the FR4 circuit traces.
3. Pretack material by placing circuit board on a hot-plate set at a temperature sufficient to soften/tackify thermoplastic slightly (90-120° C.). Roll down with a hand roller to attach. For samples with tack at room temperature, no hot plate is necessary.
4. Bonding
   4.1. Cover samples with a sheet of 3M™ Thermally Conductive Silicone Interface Pad 5300DS-.45
   4.2. Align the samples in the center of the bond thermode on a Sencorp Systems 12 AS/1 Laboratory Heat Sealer.
   4.3. Bond each sample 10 seconds at the temperatures and pressures listed in table 2.

Electrical Test

One or more samples of each construction were bonded and tested. Test results are an average of either 15 or 30 electrical resistance measurements (e.g., on one or two test PCB's). The area of each bonded connection was 6.0 mm² (1.2 mm×5.0 mm). The electrical contact resistance of each individual connection was measured by a 4-wire resistance measurement using a Keithley Model 236 Source/Measure Unit with an applied source current of 0.1 amp and a sense compliance voltage of 2.0 volts. The maximum resistance output is 20 ohms. All values reading 20 ohms or more were reported as open.

Test 1

Insulating films bonded in 2-layer construction with electrically conductive layer for measurements of electrical connection region. As shown in Table 1 below, Examples 1-1 to 1-20 exhibit relatively low contact resistance (R), and Comparative Examples C1-1 to C1-4 exhibit relatively high contact resistance (R).

TABLE 1

Test 1 Electrical Resistance results.

| Example | insulating layer | electrically conductive layer | bonding T [1] (° C.) | bond pressure [2] (psi) | R (ohms) |
|---|---|---|---|---|---|
| 1-1 | 3M ™ Thermal Bonding Film 615, 50 micron | TN-WB-14-PCN | 150 | 30 | 1.20 |
| 1-2 | 3M ™ Thermal Bonding Film 668 | TN-WB-14-PCN | 150 | 30 | 0.76 |
| 1-3 | Dynapol S-1401 | TN-WB-14-PCN | 150 | 30 | 0.13 |
| 1-4 | Elvax 420 | TN-WB-14-PCN | 150 | 30 | 0.42 |
| 1-5 | Griltex 9E-GF | TN-WB-14-PCN | 150 | 30 | 0.71 |
| 1-6 | Griltex D2279E | TN-WB-14-PCN | 150 | 30 | 0.12 |
| 1-7 | Riteflex 425 | TN-WB-14-PCN | 150 | 30 | 3.59 |
| 1-8 | 3M ™ Thermal Bonding Film 406 | Optiveil 20444A | 150 | 30 | 4.09 |
| 1-9 | 3M ™ Thermal Bonding Film 615—50 micron | Optiveil 20444A | 150 | 30 | 1.31 |
| 1-10 | 3M ™ Thermal Bonding Film 668 | Optiveil 20444A | 150 | 30 | 0.56 |
| 1-11 | 3M ™ Thermal Bonding Film 406 | Optimat 20404E | 150 | 30 | 4.19 |
| 1-12 | 3M ™ Thermal Bonding Film 615—50 micron | Optimat 20404E | 150 | 30 | 1.22 |
| 1-13 | 3M ™ Thermal Bonding Film 668 | Optimat 20404E | 150 | 30 | 1.16 |
| 1-14 | 3M ™ Anisotropic Conductive Film 7303 | TN-WB-14-PCN | 150 | 30 | 0.82 |
| 1-15 | 3M ™ Anisotropic Conductive Film 7303 | Optiveil 20444A | 150 | 30 | 8.32 |
| 1-16 | 3M ™ Anisotropic Conductive Film 7303 | Optimat 20404E | 150 | 30 | 11.75 |
| 1-17 | 3M ™ Thermal Bonding Film 406 | Optiveil 20444A | 160 | 30 | 2.08 |
| 1-18 | 3M ™ Thermal Bonding Film 406 | Optimat 20404E | 160 | 30 | 1.90 |
| 1-19 | Admer SE810 | TN-WB-14-PCN | 160 | 30 | 8.53 |
| 1-20 | Riteflex 425 | TN-WB-14-PCN | 160 | 30 | 0.95 |
| C1-1 | 3M ™ 300LSE Adhesive Transfer Tape | TN-WB-14-PCN | 25 | 30 | open |
| C1-2 | 3M ™ Adhesive Transfer Tape 467MP | TN-WB-14-PCN | 25 | 30 | open |
| C1-3 | 3M ™ 300LSE Adhesive Transfer Tape | TN-WB-14-PCN | 150 | 30 | open |
| C1-4 | 3M ™ Adhesive Transfer Tape 467MP | TN-WB-14-PCN | 150 | 30 | open |

[1] Temperature measured in the bondline after 5 seconds
[2] Gauge pressure on the bonder
[3] Examples C1-1 to C1-4 are offered as comparative examples Test 2

Bonded electrical test boards were prepared and tested as in test 1. This test illustrates different thicknesses of the same thermoplastic bonding film and use the same electrically conductive layer with changes to process conditions of bonding temperature and bond pressure. Results in Table 2. Examples 2-7 and 2-8 having relatively thick (about 200 microns) insulating layers exhibit relatively high contact resistance. This may be due to an insufficient intermixing between the insulating layer and the electrically conductive layer.

TABLE 2

| Example | insulating layer | electrically conductive layer | bonding T[1] (° C.) | bond pressure[2] (psi) | R (ohms) |
|---|---|---|---|---|---|
| 2-1 | 3M ™ Thermal Bonding Film 615—28 micron | TN-WB-14-PCN | 150 | 10 | 0.68 |
| 2-2 | 3M ™ Thermal Bonding Film 615—50 micron | TN-WB-14-PCN | 140 | 15 | 0.16 |
| 2-3 | 3M ™ Thermal Bonding Film 615—50 micron | TN-WB-14-PCN | 150 | 30 | 1.20 |
| 2-4 | 3M ™ Thermal Bonding Film 615—100 micron | TN-WB-14-PCN | 140 | 10 | 1.22 |
| 2-5 | 3M ™ Thermal Bonding Film 615—100 micron | TN-WB-14-PCN | 150 | 10 | 1.11 |
| 2-6 | 3M ™ Thermal Bonding Film 615—100 micron | TN-WB-14-PCN | 160 | 10 | 0.56 |
| 2-7 | 3M ™ Thermal Bonding Film 615—200 micron | TN-WB-14-PCN | 150 | 30 | open |
| 2-8 | 3M ™ Thermal Bonding Film 615—200 micron | TN-WB-14-PCN | 150 | 50 | open |

[1] Temperature measured in the bondline after 5 seconds
[2] Gauge pressure on the bonder Test 3

Bonded electrical test boards were prepared and tested as in Test 1. This test illustrates the effect of bonding process temperature and pressure with a given insulating layer and an electrically conductive layer. Results are shown in Table 3. The bonding temperature and pressure can be optimized to provide suitable contact resistance.

TABLE 3

| example | insulating layer | electrically conductive layer | bonding T[1] (° C.) | bond pressure[2] (psi) | R (ohms) |
|---|---|---|---|---|---|
| 3-1 | 3M ™ Thermal Bonding Film 668 | TN-WB-14-PCN | 130 | 10 | open |
| 3-2 | 3M ™ Thermal Bonding Film 668 | TN-WB-14-PCN | 130 | 30 | 1.59 |
| 3-3 | 3M ™ Thermal Bonding Film 668 | TN-WB-14-PCN | 140 | 10 | 1.36 |
| 3-4 | 3M ™ Thermal Bonding Film 668 | TN-WB-14-PCN | 140 | 30 | 0.85 |
| 3-5 | 3M ™ Thermal Bonding Film 668 | TN-WB-14-PCN | 150 | 10 | 0.49 |
| 3-6 | 3M ™ Thermal Bonding Film 668 | TN-WB-14-PCN | 150 | 30 | 0.97 |

[1] Temperature measured in the bondline after 5 seconds
[2] Gauge pressure on the bonder Test 4

For the environmental stress comparison, bonded electrical test boards were prepared and tested as in Test 1 except that a bond time of 15 seconds was used for each case. The bonded test boards were then placed into various environmental chambers for 6 different stress conditions. Stress condition A submitted bonded samples to −40 C to 85 C Thermal cycling test. Stress condition B submitted bonded samples to 21 C and 50% Relative Humidity (RH). Stress condition C submitted samples to 65 C and 90% Relative Humidity (RH). Stress condition D submitted samples to 70 C in non-humidifying chamber. Stress condition E submitted samples to 85 C in non-humidifying chamber. Stress condition F submitted samples to 85 C and 85% Relative Humidity (RH). After 6 weeks, the samples were removed from their respective stress conditions and the electrical resistance was re-measured. The Average Resistance measurements made before and after stress conditions A, B, C, D, E, and F are shown in Table 4.

TABLE 4

| Example | insulating layer | conductive layer | T[1] (° C.) | P[2] (psi) | R (ohms) in various aging conditions | | | | | |
|---|---|---|---|---|---|---|---|---|---|---|
| | | | | | A | B | C | D | E | F |
| 4-1 initial | 3M ™ TBF 615 - 50 micron | TN-WB-14-PCN | 140 | 10 | 0.33 | 0.16 | 0.31 | 0.22 | 0.25 | 0.28 |
| 4-1 (after 6 weeks) | | | | | 1.47 | 0.13 | 1.28 | 0.52 | 0.74 | 1.6 |
| 4-2 initial | 3M ™ TBF 668 | TN-WB-14-PCN | 140 | 10 | 0.07 | 0.27 | 0.17 | 0.33 | 0.09 | 0.05 |
| 4-2 (after 6 weeks) | | | | | 1.61 | 0.28 | 1.93 | 1.93 | 0.38 | 0.26 |

Test 5

For this test, samples of the two-layer construction were bonded to a generic board shield frame as representation of final product implementation. After bonding, electrical conductivity was measured at the bonded periphery and both surfaces in the center of the shield can frame. Measurement results are listed below in Table 5.

Materials

1. Laird Technologies Board Shield Frame EMI-S-202F. (0.65 inch×0.65 inch, with a 1.5 mm wide periphery ledge)
2. 2 layer constructions were prepared as described in Test 1.

Preparation of Test Samples
1. Cut a 0.65 inch×0.65 inch piece of the two layer construction.
2. Align the piece of 2 layer construction on the top of the board shield frame. Material is placed insulating side against the board shield frame. Board shield frame can be pre-warmed on a hot plate set at 90° C. to assist in pre-tacking process.
3. Place shield frame with 2-layer construction on a hot-plate set at a temperature sufficient to soften/tackify thermoplastic slightly (90° C.). Roll down with a hand roller to attach. For samples with tack at room temperature, no hot plate is necessary.
4. Bonding
   4.1 Cover samples with a sheet of 3M™ Thermally Conductive Silicone Interface Pad 5300DS-.45
   4.2 Align the samples in the center of the bond thermode on a Sencorp Systems 12 AS/1 Laboratory Heat Sealer.
   4.3 Bond each sample 10 seconds at the temperatures and pressures listed in Table 5.

Electrical Test

One samples of each construction was bonded and tested. The electrical resistance was using a Keithley Model 200-20 Multimeter in 4-wire mode, using Keithley Cat 1 42Vpk 4-wire probes.
1. Conductive layer resistance (top): Measured by probing multiple areas on the top/conductive layer of the bonded construction. Probes were placed at a distance of 1-2 cm apart. Results are an average of 5 measurements.
2. Insulating layer resistance (bottom): Measured by probing multiple areas on the bottom/insulating layer of the bonded construction. Probes were placed at a distance of 1-2 cm apart. Results are an average of 5 measurements.
3. Connection resistance at periphery of the board shield frame: Measured by placing one probe on the conductive top layer and the second probe on the side of the shield frame.

TABLE 5

Electrical measurements made from typical shield can configuration

| | Measured resistance [ Ohms ] | | |
|---|---|---|---|
| Example | Conductive side | Insulative side | Conductive side through to frame |
| 5-1<br>3M ™ Thermal Bonding Film 615—50 micron insulating layer with TN-WB-14-PCN conductive layer bonded at 140 C. and 10 psi | 0.054 | open | 0.122 |
| 5-2<br>3M ™ Thermal Bonding Film 668 insulating layer with TN-WB-14-PCN conductive layer bonded at 140 C. and 10 psi | 0.052 | open | 0.078 |
| 5-3<br>3M ™ Anisotropic Conductive Film 7303 with TN-WB-14-PCN conductive layer bonded at 150 C. and 10 psi | 0.060 | open | 0.054 |
| Comparative 5-1<br>3M ™ Adhesive Transfer Tape 467MP insulating layer with TN-WB-14-PCN conductive layer bonded at 25 C. and 10 psi | 0.046 | open | open |
| Comparative 5-2<br>3M ™ 300LSE Adhesive Transfer Tape insulating layer with TN-WB-14-PCN conductive layer bonded at 25 C. and 10 psi | 0.052 | open | open |
| Comparative 5-3<br>3M ™ 300LSE Adhesive Transfer Tape insulating layer with TN-WB-14-PCN conductive layer bonded at 140 C. and 10 psi | 0.048 | open | open |

[1] Temperature measured in the bondline after 5 seconds
[2] Gauge pressure on the bonder Test 6

For this test, samples of the two-layer construction were bonded to a stainless steel substrate to measure peel adhesion. Measurement results are listed below in Table 6.

Preparation of Peel Adhesion Test Samples
1. Prepare the 2 layer construction as described in Example 1.
2. Cut a 0.5 inch×3.5 inch piece of the 2 layer construction.
3. Align the piece of 2 layer construction on the top of a 1 inch×4 inch×3.5 mil thick stainless steel test panel. Material is placed insulating side against the stainless steel panel. Align a ½ inch×5 inch×4 mil thick piece of aluminum foil on top of the 2 layer construction.
4. Place above sample with 2-layer construction on a hot-plate set at a temperature sufficient to soften/tackify thermoplastic slightly (90° C.). Roll down with a hand roller to attach. For samples with tack at room temperature, no hot plate is necessary.
5. Bonding
   a. Cover samples with a sheet of 3M™ Thermally Conductive Silicone Interface Pad 5300DS-.45
   b. Align the samples in the center of the bond thermode on a Sencorp Systems 12 AS/1 Laboratory Heat Sealer.
   c. Bond each sample at 10 psi$^2$ with the time and temperature listed in Table 7.
6. Peel Test: Samples were peeled at 2 inches/minute in a 90 degree peel mode on an MTS Model Insight 30EL tensile tester with a SOON load cell. The average peel force is reported, and results are an average of two bonded samples of each 2 layer construction.

TABLE 6

| Example | insulating layer | electrically conductive layer | bonding T$^1$ (° C.) | bond time (sec) | Average peel adhesion (lb/in) |
|---|---|---|---|---|---|
| 6-1 | 3M ™ Thermal Bonding Film 615—50 micron | TN-WB-14-PCN | 150 | 20 | 7.90 |
| C6-1 | 3M ™ 300LSE Adhesive Transfer Tape | TN-WB-14-PCN | 150 | 20 | 4.57 |

[1] Temperature measured in the bondline after 5 seconds
[2] Gauge pressure on the bonder Test 7

Examples 7-1 through 7-5 each having a tri-layer configuration as shown in FIG. 1B were prepared. In the tri-layer configuration, an electrically conductive carbon fiber layer was sandwiched by two thermal bonding films. The carbon fibers in Examples 7-1 and 7-2 were coated with nickel, and the carbon fibers in Examples 7-3 to 7-5 were coated with copper and nickel. Table 7 below summaries testing results for Examples 7-1 through 7-5.

TABLE 7

| Examples | Fiber layer thickness (mm) | Total Thickness (mm) | Bonding Temp: 130° C. | | Bonding Temp: 140° C. | |
|---|---|---|---|---|---|---|
| | | | R(ohms) | Peel (oz/in) | R(ohms) | Peel (oz/in) |
| 7-1 | 0.11 | 0.17 | 2.7 | 132.08 | 1.1 | 143.31 |
| 7-2 | 0.32 | 0.38 | 0.3 | 144.26 | 0.4 | 130.38 |
| 7-3 | 0.1 | 0.16 | 15 | | 1.9 | |
| 7-4 | 0.2 | 0.26 | 0.3 | 117.82 | 0.3 | 97.39 |
| 7-5 | 0.3 | 0.36 | 0.1 | | 0.1 | |

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A flexible film comprising:
   an electrically conductive layer, and first and second electrically insulating layers, the electrically conductive layer being sandwiched by the first and second electrically insulating layers in a layered structure, the layered structure having a first major surface on a side of the first electrically insulating layer and a second major surface on a side of the second electrically insulating layer opposite the first major surface,
   the layered structure extending continuously from at least one first zone to at least one second zone along a lateral direction of the flexible film, and the at least one first zone being positioned around a periphery of the respective at least one second zone, and
   in the at least one first zone the electrically conductive layer and the first and second electrically insulating layers being at least partially intermixed with each other to provide an electrically conductive surface in the at least one first zone on a side of the first major surface of the layered structure, and in the at least one second zone the first major surface remaining electrically non-conductive.

2. The flexible film of claim 1, wherein the layered structure has a thinner thickness in the at least one first zone than the respective at least one second zone.

3. The flexible film of claim 1, wherein the electrically conductive surface in the at least one first zone on the side of the first major surface is electrically connected to the electrically conductive layer.

4. The flexible film of claim 1, wherein the layered structure in the at least one first zone is flowable and bondable to a metal surface upon at least one of heat and pressure.

5. The flexible film of claim 1, wherein at least one of the first and second electrically insulating layers is curable by one or more of heat, UV, moisture, and pressure.

6. The flexible film of claim 1, wherein the electrically conductive layer comprises an electrically conductive non-woven material.

7. The flexible film of claim 6, wherein the electrically conductive non-woven material comprises a plurality of electrically conductive fibers.

8. The flexible film of claim 1, further comprising a fourth layer disposed on at least one of the first and second major surfaces of the layered structure.

9. A system comprising:
   an electrically conductive fence disposed on and projecting from a major surface of a circuit board, the electrically conductive fence at least partially surrounding one or more of electronic components on the circuit board, the electrically conductive fence being connected to a different second electrically conductive trace of the circuit board; and
   a flexible film disposed on a top of the electrically conductive fence, and facing the major surface of the circuit board, the flexible film comprising:
   an electrically conductive layer, and first and second electrically insulating layers, the electrically conductive layer being sandwiched by the first and second electrically insulating layers in a layered structure, the layered structure having a first major surface on a side of the first electrically insulating layer and a second major surface on a side of the second electrically insulating layer opposite the first major surface,
   the layered structure extending continuously from at least one first zone to at least one second zone along a lateral direction of the flexible film, and the at least one first zone being positioned around a periphery of the respective at least one second zone, and
   in the at least one first zone the electrically conductive layer and the first and second electrically insulating layers being at least partially intermixed with each other to provide an electrically conductive surface in the at least one first zone on a side of the first major surface of the layered structure, and in the at least one second zone the first major surface remaining electrically non-conductive, wherein the at least one first zone of the flexible film is directly bonded to the top of the electrically conductive fence.

10. The system of claim 9, wherein a first electrically conductive trace is a signal trace and the second electrically conductive trace is a ground trace.

11. The system of claim 9, wherein the electrically conductive fence has a first height at a first portion, and a second height at a second portion, the first and second heights are different, and a bottom surface of the flexible film in the at least one first zone has a profile that accommodates the different first and second heights.

12. The system of claim 9, wherein the top of the electrically conductive fence includes a non-flat surface.

13. The system of claim 9, wherein the at least one first zone comprises a plurality of first zones, each of the first zones has a bottom surface attached to respective tops of different portions of the electrically conductive fence.

14. The system of claim 9, wherein the at least one second zone comprises a plurality of second zones that are separated by at least one of the first zone, and each of the second zones covers respective spaces of the circuit board that are at least partially enclosed by the electrically conductive fence.

15. A method of making a flexible film, the method comprising:

arranging a first electrically insulating layer, an electrically conductive layer, and a second electrically insulating layer in a layered structure, the electrically conductive layer being sandwiched by the first and second electrically insulating layers, the layered structure having a first major surface on a side of the first electrically insulating layer and a second major surface on a side of the second electrically insulating layer opposite the first major surface;

selectively treating at least one first zone of the layered structure such that the electrically conductive layer and the first and second electrically insulating layers are at least partially intermixed with each other in the least one first zone to provide an electrically conductive surface in the at least one first zone on a side of the first major surface of the layered structure, and in the at least one second zone the first major surface being electrically non-conductive, wherein the layered structure extends continuously from the at least one first zone to at least one second zone along a lateral direction of the flexible film, and the at least one first zone is positioned around a periphery of the respective at least one second zone.

16. The method of claim 15, wherein selectively treating the at least one first zone comprises applying at least one of pressure and heat onto the layered structure in the at least one first zone.

17. The method of claim 15, wherein selectively treating the at least one first zone comprises thermal-embossing the layered structure in the at least one first zone.

18. The method of claim 15, wherein thermal-embossing the at least one first zone comprises applying a pre-former tool to press against a bottom surface of the flexible film in the at least one first zone.

19. The method of claim 15, wherein selectively treating the at least one first zone comprises pressing the first major surface in the at least one first zone against a top of an electrically conductive fence on a circuit board.

20. The method of claim 15, wherein selectively treating at least one first zone of the layered structure reduces the thickness thereof.

* * * * *